United States Patent
Park et al.

(10) Patent No.: US 10,854,832 B2
(45) Date of Patent: Dec. 1, 2020

(54) PHOTOELECTRIC DEVICES AND IMAGE SENSORS AND ELECTRONIC DEVICES

(71) Applicant: Samsung Electronics Co., Ltd., Suwon-si (KR)

(72) Inventors: Kyung Bae Park, Hwaseong-si (KR); Chul Joon Heo, Busan (KR); Moon Gyu Han, Suwon-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 99 days.

(21) Appl. No.: 16/178,692

(22) Filed: Nov. 2, 2018

(65) Prior Publication Data

US 2019/0214591 A1    Jul. 11, 2019

(30) Foreign Application Priority Data

Jan. 5, 2018    (KR) .................. 10-2018-0001611

(51) Int. Cl.
*H01L 51/42* (2006.01)
*H01L 27/30* (2006.01)
(Continued)

(52) U.S. Cl.
CPC ........ *H01L 51/4213* (2013.01); *H01L 27/307* (2013.01); *H01L 51/4253* (2013.01);
(Continued)

(58) Field of Classification Search
CPC ............... H01L 27/307; H01L 51/441; H01L 51/4213; H01L 51/4253
See application file for complete search history.

(56) References Cited

U.S. PATENT DOCUMENTS

| 8,231,471 B2 | 7/2012 | Blackburn et al. |
| 9,159,753 B2 | 10/2015 | Hynecek |

(Continued)

FOREIGN PATENT DOCUMENTS

| JP | S6469686 A | 3/1989 |
| JP | 2010-232410 A | 10/2010 |

(Continued)

OTHER PUBLICATIONS

Navjeet Sharma et al., Effect of substrate temperature on structural and optical properties of thermally evaporated thin films of $F_{16}CuPc$; Pelagia Research Library, ISSN: 0976-8610, Advances in Applied Research, 2014 5(2): 111-116.

(Continued)

*Primary Examiner* — Peniel M Gumedzoe
(74) *Attorney, Agent, or Firm* — Harness, Dickey & Pierce, P.L.C.

(57) ABSTRACT

A photoelectric device includes a first electrode and a second electrode facing each other and a photoelectric conversion layer between the first electrode and the second electrode and configured to convert light in a particular wavelength spectrum of light of a visible wavelength spectrum of light into an electric signal. The photoelectric conversion layer may include a p-type semiconductor configured to selectively absorb light in a first wavelength spectrum and an n-type semiconductor having a peak absorption wavelength in a second wavelength spectrum of greater than or equal to about 750 nm, an image sensor. The photoelectric conversion layer may include a first semiconductor of an absorption spectrum of a first peak absorption wavelength, and a second semiconductor of an absorption spectrum of a second peak absorption wavelength that is longer than the first peak absorption wavelength by at least about 100 nm.

23 Claims, 18 Drawing Sheets

(51) Int. Cl.
*H01L 51/44* (2006.01)
*H01L 51/00* (2006.01)
*H01L 27/146* (2006.01)

(52) U.S. Cl.
CPC ...... *H01L 51/441* (2013.01); *H01L 27/14621* (2013.01); *H01L 51/006* (2013.01); *H01L 51/0061* (2013.01); *H01L 51/0072* (2013.01); *H01L 51/0077* (2013.01); *H01L 51/0078* (2013.01); *H01L 51/0091* (2013.01); *H01L 2251/552* (2013.01)

(56) References Cited

U.S. PATENT DOCUMENTS

| | | | |
|---|---|---|---|
| 9,735,365 B2 | 8/2017 | Kim et al. | |
| 2005/0205879 A1* | 9/2005 | Fukunaga | B82Y 10/00 257/80 |
| 2006/0054987 A1* | 3/2006 | Nii | H01L 27/14621 257/440 |
| 2009/0058262 A1* | 3/2009 | Lu | B82Y 10/00 313/503 |
| 2011/0214736 A1 | 9/2011 | Lee et al. | |
| 2014/0054577 A1 | 2/2014 | Mitsui et al. | |
| 2015/0060775 A1* | 3/2015 | Liang | H01L 51/002 257/40 |
| 2016/0005983 A1 | 1/2016 | Thompson et al. | |
| 2016/0064455 A1* | 3/2016 | Leem | H01L 27/307 257/40 |
| 2016/0380032 A1* | 12/2016 | Park | H01L 27/14645 257/40 |
| 2017/0084852 A1* | 3/2017 | Afzali-Ardakani | H01L 51/4213 |

FOREIGN PATENT DOCUMENTS

| | | |
|---|---|---|
| JP | 5216279 B2 | 6/2013 |
| JP | 5352133 B2 | 11/2013 |
| JP | 2016-015410 A | 1/2016 |
| JP | 5881116 B2 | 3/2016 |
| JP | 2016-225456 A | 12/2016 |
| KR | 2014-0115238 A | 9/2014 |
| KR | 1514207 B1 | 4/2015 |
| KR | 1666600 B1 | 10/2016 |
| KR | 1636687 B1 | 6/2018 |
| WO | WO-2015150120 A2 | 10/2015 |
| WO | WO-2016-120166 A1 | 8/2016 |

OTHER PUBLICATIONS

J.B. Wang et al., "High speed responsive near infrared photodetector focusing on 808 nm radiation using hexadecafluoro-copper-phthalocyanine as the acceptor", Organic Electronics, 12 (2011) 34-38.

Martin J. Wienk et al., "Narrow-Bandgap Diketo-Pyrrolo-Pyrrole Polymer Solar Cells: The Effect of Processing on the Performance", Advanced Materials, DO1: 10.1002/adma.200800456, 2008, 20, 2556-2560.

Minquan Tian et al., "Discovery of Novel Dyes with Absorption Maxima at 1.1µm", JACS Communications, J.A. Chem Soc. 2003, 125, 348-349.

Hui Zhang et al., Transparent Organic Photodetector using a Near-Infrared Absorbing Cyanine Dye, Scientific Reports, Published Mar. 24, 2015.

Qayyum Zafar et al., Eco-benign visible wavelength photodetector based on phthalocyanine-low bandgap copolymer composite blend, RSC Advances, Published Jan. 2016.

Extended European Search Report dated May 31, 2019 for corresponding European Application No. 18205756.2.

Jiang et al., "Organic photovoltaic cells using hexadecafluorophthalocyaninatocopper ($F_{16}CuPc$) as electron acceptor material", Chemical Physics Letters, Elsevier VB, NL, vol. 446, No. 4-6, Sep. 25, 2007, pp. 329-332, XP022267976.

Yang J. L. et al., "Copper hexadecafluorophthalocyanine ($F_{16}CuPc$) as an electron accepting material in bilayer small molecule organic photovoltaic cells", Organic Electronics, Elsevier, Amsterdam, NL, vol. 11, No. 8, Aug. 1, 2010, pp. 1399-1402.

Elena Jakubikova et al., "Effects of Peripheral and Axial Substitutions on Electronic Transitions of Tin Naphthalocyanines", Journal of Physical Chemistry, A, Molecules, Spectroscopy, Kinetics, Environment and General Theory, vol. 115, No. 33, Aug. 25, 2011, pp. 9265-9272.

* cited by examiner

PHOTOELECTRIC DEVICES AND IMAGE SENSORS AND ELECTRONIC DEVICES

CROSS-REFERENCE TO RELATED APPLICATION

This application claims priority to and the benefit of, under 35 U.S.C. § 119, Korean Patent Application No. 10-2018-0001611 filed in the Korean Intellectual Property Office on Jan. 5, 2018, the entire contents of which are incorporated herein by reference.

BACKGROUND

1. Field

Photoelectric devices, image sensors, and electronic devices are disclosed.

2. Description of the Related Art

Photoelectric devices convert light into electrical signals using photoelectric effects. A given photoelectric device may include a photodiode, a phototransistor, and the like. Photoelectric devices may be applied to ("included in") an image sensor, a solar cell, an organic light emitting diode, and the like.

Image sensors including photo-sensing devices ("photodiodes") may require high resolution and thus a small pixel. At present, silicon photodiodes are widely used, but silicon photodiodes have a problem of deteriorated sensitivity, due to silicon photodiodes having a small absorption area due to small pixels. Accordingly, an organic material that is capable of replacing silicon has been researched.

An organic material has a high extinction coefficient and may selectively absorb light in a particular wavelength spectrum of light depending on a molecular structure, and thus may simultaneously replace a photodiode and a color filter and resultantly improve sensitivity and contribute to high integration.

However, since the organic material exhibits different characteristics from those of silicon due to high binding energy and a recombination behavior, the characteristics of the organic material are difficult to precisely predict, and thus required properties of a photoelectric device may not be easily controlled.

SUMMARY

Some example embodiments provide a photoelectric device having high wavelength selectivity.

Some example embodiments provide an image sensor including the photoelectric device.

Some example embodiments provide an electronic device including the image sensor.

According to some example embodiments, a photoelectric device may include a first electrode and a second electrode facing each other, and a photoelectric conversion layer between the first electrode and the second electrode. The photoelectric conversion layer may be configured to convert light in a particular portion of a visible wavelength spectrum of light into an electric signal. The photoelectric conversion layer may include a p-type semiconductor configured to selectively absorb light in a first wavelength spectrum of light of the visible wavelength spectrum of light and an n-type semiconductor having a peak absorption wavelength in a second wavelength spectrum of light of greater than or equal to about 750 nm.

The n-type semiconductor may have an energy bandgap of about 1.0 eV to about 1.5 eV.

The n-type semiconductor may have a lowest unoccupied molecular orbital (LUMO) energy level of about 3.5 eV to about 5.5 eV, and the n-type semiconductor may have a highest occupied molecular orbital (HOMO) energy level of about 4.5 eV to about 7.0 eV.

The n-type semiconductor may have a peak absorption wavelength in a wavelength spectrum of light of about 800 nm to about 1100 nm.

The p-type semiconductor may be configured to selectively absorb one wavelength spectrum of light having a first peak absorption wavelength, such that the one wavelength spectrum is one of blue light such that the first peak absorption wavelength is in a blue wavelength spectrum of about 380 nm to about 500 nm, green light such that the first peak absorption wavelength is in a green wavelength spectrum of about 500 nm to about 600 nm, or ted light such that the first peak absorption wavelength is in a red wavelength spectrum of about 600 nm to about 700 nm. An extinction coefficient at the first peak absorption wavelength may be greater than or equal to about $0.5 \times 10^5$ cm$^{-1}$.

The p-type semiconductor may be configured to selectively absorb green light having a peak absorption wavelength in a wavelength spectrum of about 520 nm to about 580 nm.

The photoelectric conversion layer may be configured to selectively absorb green light having a peak absorption wavelength in the wavelength spectrum of about 520 nm to about 580 nm, and a ratio ($EQE_{450\ nm}/EQE_{max}$) of external quantum efficiency ($EQE_{450\ nm}$) at 450 nm relative to external quantum efficiency ($EQE_{max}$) at the peak absorption wavelength of the photoelectric conversion layer may be less than or equal to about 0.30.

The p-type semiconductor may be an organic semiconductor having a core structure including an electron donating moiety, a pi conjugation linking group, and an electron accepting moiety.

The photoelectric conversion layer may not include fullerene or a fullerene derivative.

The photoelectric device may further include a charge auxiliary layer between the first electrode and the photoelectric conversion layer, the charge auxiliary layer having an energy bandgap of greater than or equal to about 2.8 eV.

According to some example embodiments, a photoelectric device may include a first electrode and a second electrode facing each other, and a photoelectric conversion layer between the first electrode and the second electrode. The photoelectric conversion layer may be configured to electrically convert one of blue light, green light, or red light. The photoelectric conversion layer may include a first semiconductor associated with an absorption spectrum of a first peak absorption wavelength, and a second semiconductor associated with an absorption spectrum of a second peak absorption wavelength that is longer than the first peak absorption wavelength by about 100 nm or greater.

The first peak absorption wavelength may be in one wavelength spectrum of a blue wavelength spectrum of about 380 nm to about 500 nm, a green wavelength spectrum of about 500 nm to about 600 nm, and a red wavelength spectrum of about 600 nm to about 700 nm. The second peak absorption wavelength may be in an infrared wavelength spectrum of greater than or equal to about 750 nm.

The first peak absorption wavelength may be in a wavelength spectrum of about 520 nm to about 580 nm, and the second peak absorption wavelength may be in a wavelength spectrum of about 800 nm to about 1100 nm.

The first semiconductor may have an energy bandgap of about 1.7 eV to about 2.3 eV, and the second semiconductor may have an energy bandgap of about 1.0 eV to about 1.5 eV.

The photoelectric conversion layer may not include fullerene or a fullerene derivative.

An image sensor may include the photoelectric device. The image sensor may further include a semiconductor substrate on the photoelectric device.

The photoelectric device may include a first photoelectric device configured to convert first visible light into a first electric signal, the first visible light being one of blue light, green light, and red light, a second photoelectric device on the first photoelectric device, the second photoelectric device configured to convert second visible light into a second electric signal, the second visible light being one of blue light, green light, and red light, and a third photoelectric device on the second photoelectric device, the third photoelectric device configured to convert third visible light into a third electric signal, the third visible light being one of blue light, green light, and red light, The first visible light, the second visible light, and the third visible light may be different from each other.

The image sensor may further include an infrared filter on one surface of the photoelectric device.

An electronic device may include the image sensor.

According to some example embodiments, a photoelectric conversion device configured to convert light in a particular portion of a visible wavelength spectrum of light into an electric signal may include a p-type semiconductor configured to selectively absorb light in a first wavelength spectrum of light of the visible wavelength spectrum of light, and an n-type semiconductor having a peak absorption wavelength in a second wavelength spectrum of light of greater than or equal to about 750 nm.

The n-type semiconductor may have an energy bandgap of about 1.0 eV to about 1.5 eV.

The n-type semiconductor may have a lowest unoccupied molecular orbital (LUMO) energy level of about 3.5 eV to about 5.5 eV, and the n-type semiconductor has a highest occupied molecular orbital (HOMO) energy level of about 4.5 eV to about 7.0 eV.

The n-type semiconductor may have a peak absorption wavelength in a wavelength spectrum of light of about 800 nm to about 1100 nm.

The p-type semiconductor may be configured to selectively absorb one wavelength spectrum of light having a first peak absorption wavelength, such that the one wavelength spectrum is one of blue light such that the first peak absorption wavelength is in a blue wavelength spectrum of about 380 nm to about 500 nm, green light such that the first peak absorption wavelength is in a green wavelength spectrum of about 500 nm to about 600 nm, or red light such that the first peak absorption wavelength is in a red wavelength spectrum of about 600 nm to about 700 nm. An extinction coefficient at the first peak absorption wavelength may be greater than or equal to about $0.5 \times 10^5$ cm$^{-1}$.

The p-type semiconductor may be configured to selectively absorb green light having a peak absorption wavelength in a wavelength spectrum of about 520 nm to about 580 nm.

The photoelectric conversion device may be configured to selectively absorb green light having a peak absorption wavelength in the wavelength spectrum of about 520 nm to about 580 nm, and a ratio ($EQE_{450\ nm}/EQE_{max}$) of external quantum efficiency ($EQE_{450\ nm}$) at 450 nm relative to external quantum efficiency ($EQE_{max}$) at the peak absorption wavelength of the photoelectric conversion layer may be less than or equal to about 0.30.

The p-type semiconductor may be an organic semiconductor having a core structure including an electron donating moiety, a pi conjugation linking group, and an electron accepting moiety.

According to some example embodiments, a photoelectric conversion device may be configured to electrically convert one of blue light, green light, or red light. The photoelectric conversion device may include a first semiconductor associated with an absorption spectrum of a first peak absorption wavelength and a second semiconductor associated with an absorption spectrum of a second peak absorption wavelength that is longer than the first peak absorption wavelength by about 100 nm or greater.

The first peak absorption wavelength may be in one wavelength spectrum of a blue wavelength spectrum of about 380 nm to about 500 nm, a green wavelength spectrum of about 500 nm to about 600 nm, and a red wavelength spectrum of about 600 nm to about 700 nm. The second peak absorption wavelength may be in an infrared wavelength spectrum of greater than or equal to about 750 nm.

The first peak absorption wavelength may be in a wavelength spectrum of about 520 nm to about 580 nm. The second peak absorption wavelength may be in a wavelength spectrum of about 800 nm to about 1100 nm.

The first semiconductor may have an energy bandgap of about 1.7 eV to about 2.3 eV, and the second semiconductor may have an energy bandgap of about 1.0 eV to about 1.5 eV.

The photoelectric conversion device may not include fullerene or a fullerene derivative.

According to some example embodiments, an image sensor may include a semiconductor substrate, and a plurality of photoelectric devices on the semiconductor substrate. The plurality of photoelectric devices may be configured to convert different ones of blue light, green light, or red light into electric signals, respectively. Each photoelectric device of the plurality of photoelectric devices may include a first electrode and a second electrode facing each other, and a photoelectric conversion layer between the first electrode and the second electrode, the photoelectric conversion layer configured to electrically convert a third light of blue light, green light, or red light. The photoelectric conversion layer may include a first semiconductor associated with an absorption spectrum of a first peak absorption wavelength, and a second semiconductor associated with an absorption spectrum of a second peak absorption wavelength that is longer than the first peak absorption wavelength by about 100 nm or greater.

The image sensor may further include an infrared photoelectric device on the semiconductor substrate, the infrared photoelectric device configured to convert infrared light into electric signals.

The infrared photoelectric device may be on the plurality of photoelectric devices.

The infrared photoelectric device may be between the plurality of photoelectric devices and the semiconductor substrate.

DETAILED DESCRIPTION

Figure 1:
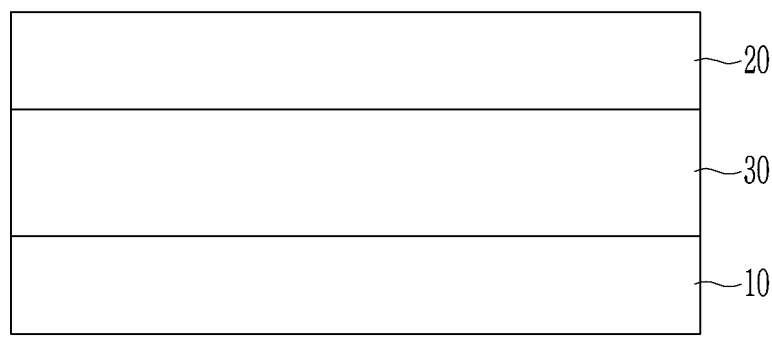
FIG. 1 is a cross-sectional view showing a photoelectric device according to some example embodiments.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, "combination" refers to a mixture of two or more and a stack structure of two or more.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to inclusion of one to three heteroatoms selected from O, S, P, and Si.

As used herein, "metal" refers to a metal and a semimetal.

Hereinafter, a highest occupied molecular orbital (HOMO) energy level is expressed as an absolute value from a vacuum level. In addition, when the HOMO energy level is said to be "deep," "high," or "large," the HOMO energy level has a large absolute value from "0 eV" of the vacuum level, while when the HOMO energy level is "shallow," "low," or "small," the HOMO energy level has a small absolute value from "0 eV" of the vacuum level.

Hereinafter, as used herein, when a definition is not otherwise provided, each characteristic is measured in state of a thin film (deposited thin film).

Hereinafter, a photoelectric device according to some example embodiments is described with reference to the drawings.

FIG. 1 is a cross-sectional view showing a photoelectric device according to some example embodiments.

Referring to FIG. 1, a photoelectric device 100 according to some example embodiments includes a first electrode (also referred to herein as a lower electrode) 10 and a second electrode (also referred to herein as an upper electrode) 20 facing each other and a photoelectric conversion layer 30 (also referred to herein as a photoelectric conversion device) between the first electrode 10 and the second electrode 20.

A substrate (not shown) may be disposed on a surface of the first electrode 10 or a surface of the second electrode 20. The substrate may be for example made of an inorganic material such as glass, an organic material such as polycarbonate, polymethylmethacrylate, polyethyleneterephthalate, polyethylenenaphthalate, polyamide, polyethersulfone, or a combination thereof, or a silicon wafer.

One of the first electrode 10 and the second electrode 20 may be an anode and the other may be a cathode. For example, the first electrode 10 may be an anode and the second electrode 20 may be a cathode.

At least one of the first electrode 10 and the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AlTO), and fluorine doped tin oxide (FTO), or a metal thin layer of a single layer or a multilayer. When one of the first electrode 10 and the second electrode 20 is a non-light-transmitting electrode, it may be made of for example an opaque conductor such as aluminum (Al), silver (Ag), or gold (Au). For example, the first electrode 10 and the second electrode 20 may be all light-transmitting electrodes. For example, the second electrode 20 may be a light receiving electrode disposed at a light receiving side.

The photoelectric conversion layer 30 may be configured to convert light of at least one part of a wavelength spectrum of light of a visible wavelength spectrum of light (e.g., a particular portion of a visible wavelength spectrum of light) into an electric signal, and may for example convert at least a part of light of a green wavelength spectrum of light (hereinafter, referred to as 'green light'), light of a blue wavelength spectrum of light (hereinafter, referred to as 'blue light'), and light of a red wavelength spectrum of light (hereinafter, referred to as 'red light') into an electric signal.

For example, the photoelectric conversion layer 30 may be configured to convert one of green light, blue light, or red light into an electric signal (e.g., "electrically convert one of green light, blue light, or red light").

For example, the photoelectric conversion layer 30 may selectively absorb light in a at least one part of a wavelength spectrum of light of a visible wavelength spectrum of light and may for example selectively absorb a part of green light, blue light, and red light.

For example, the photoelectric conversion layer 30 may selectively absorb one of the green light, the blue light, and the red light. Herein, the selective absorption of at least one from the green light, the blue light, and the red light means that an absorption spectrum thereof has a peak absorption wavelength (λmax) in one range among the ranges of about 500 nm to about 600 nm, greater than or equal to about 380 nm and less than about 500 nm, and greater than about 600 nm and less than or equal to about 700 nm and is remarkably higher in a corresponding wavelength spectrum of light than in the other wavelength spectrum of lights. For example, the photoelectric conversion layer 30 may selectively absorb green light.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The photoelectric conversion layer 30 is a layer including at least one p-type semiconductor and at least one n-type semiconductor to provide a pn junction, which is a layer configured to produce excitons based on receiving light from outside ("an external environment that is external to the photoelectric device 100) and then separating holes and electrons from the produced excitons. As described herein, one of the p-type semiconductor and the n-type may be referred to as a "first semiconductor," and the other of the p-type semiconductor and n-type semiconductor may be referred to as a "second semiconductor."

Each of the p-type semiconductor and the n-type semiconductor may be a light absorbing material. For example, at least one of the p-type semiconductor and the n-type semiconductor may be an organic light absorbing material. For example, at least one of the p-type semiconductor and the n-type semiconductor may be a wavelength-selective light absorbing material that is configured to selectively absorb light in a particular (or, alternatively, predetermined) wavelength spectrum of light, and for example at least one of the p-type semiconductor and the n-type semiconductor may be a wavelength-selective organic light absorbing material.

The p-type semiconductor and the n-type semiconductor may have different light absorption characteristics, and for example a wavelength spectrum of light that p-type semiconductor is configured to mainly absorb may be different from the wavelength spectrum of light that the n-type semiconductor is configured to mainly absorb. For example, the p-type semiconductor may be configured to selectively absorb light in a first wavelength spectrum of light of a visible wavelength spectrum of light, and the n-type semiconductor may be configured to selectively absorb light in a second wavelength spectrum of light of the visible wavelength spectrum of light. The first and second wavelength spectra of light may be different from each other or may be a common wavelength spectrum.

For example, one of the p-type semiconductor and the n-type semiconductor (e.g., a first semiconductor) may have an absorption spectrum of a first peak absorption wavelength and the other of the p-type semiconductor and the n-type semiconductor (e.g., the second semiconductor) may have an absorption spectrum of a second peak absorption wavelength that is a longer wavelength than the first peak absorption wavelength by about 100 nm or greater. Herein, the first peak absorption wavelength (e.g., in the first wavelength spectrum of light) may belong to a visible wavelength spectrum of light, for example one of blue light, green light, and red light, for example one of a blue wavelength spectrum of light of greater than or equal to about 380 nm and less than about 500 nm, a green wavelength spectrum of light of about 500 nm to about 600 nm, and a red wavelength spectrum of light of greater than about 600 nm and less than or equal to about 700 nm and the second peak absorption wavelength (e.g., in the second wavelength spectrum of light) may belong to an infrared wavelength spectrum of light, for example a wavelength spectrum of light of greater than or equal to about 750 nm, for example about 780 nm to about 1300 nm.

For example, the p-type semiconductor may have an absorption spectrum of the first peak absorption wavelength (e.g., in the first wavelength spectrum) and the n-type semiconductor may have an absorption spectrum of the second peak absorption wavelength (e.g., in the second wavelength spectrum) that is longer wavelength than the first peak absorption wavelength by about 100 nm or greater.

For example, the first peak absorption wavelength of the p-type semiconductor may belong to one of a blue wavelength spectrum of light of greater than or equal to about 380 nm and less than about 500 nm, a green wavelength spectrum of light of about 500 nm to about 600 nm, and a red wavelength spectrum of light of greater than about 600 nm and less than or equal to about 700 nm, wherein an extinction coefficient at the first peak absorption wavelength may be greater than or equal to about $0.5 \times 10^5$ cm$^{-1}$, for example about $0.5 \times 10^5$ cm$^{-1}$ to about $1.5 \times 10^5$ cm$^{-1}$. Restated, the p-type semiconductor may be configured to selectively absorb one wavelength spectrum of light having a first peak absorption wavelength, such that the one wavelength spectrum is one of 1) blue light such that the first peak absorption wavelength is in a blue wavelength spectrum of about 380 nm to about 500 nm, 2) green light such that the first peak absorption wavelength is in a green wavelength spectrum of about 500 nm to about 600 nm, or 3) red light such that the first peak absorption wavelength is in a red wavelength spectrum of about 600 nm to about 700 nm, and an extinction coefficient at the first peak absorption wavelength is greater than or equal to about $0.5 \times 105$ cm−1.

For example, the second peak absorption wavelength of the n-type semiconductor may belong to an infrared wavelength spectrum of light, for example a wavelength spectrum of light of greater than or equal to about 750 nm, for example about 780 nm to about 1300 nm.

For example, the first peak absorption wavelength of the p-type semiconductor may belong to about 500 nm to about 600 nm and the second peak absorption wavelength of the n-type semiconductor may be about 780 nm to about 1300 nm. Within the ranges, the first peak absorption wavelength of the p-type semiconductor may for example belong to about 510 nm to about 590 nm and the second peak absorption wavelength of the n-type semiconductor may for example belong to about 790 nm to about 1200 nm, or within the ranges, the first peak absorption wavelength of the p-type semiconductor may for example belong to a wavelength spectrum of about 520 nm to about 580 nm and the second peak absorption wavelength of the n-type semiconductor may for example belong to a wavelength spectrum of about 800 nm to about 1100 nm. In some example embodiments, the p-type semiconductor is configured to selectively absorb green light having a peak absorption wavelength in a wavelength spectrum of about 520 nm to about 580 nm.

The p-type semiconductor and the n-type semiconductor may have different electrical characteristics, for example an energy bandgap, a highest occupied molecular orbital (HOMO) energy level, and a lowest unoccupied molecular orbital (LUMO) energy level of the p-type semiconductor and the n-type semiconductor.

For example, one of the p-type semiconductor and the n-type semiconductor may have an energy bandgap of about 1.0 eV to about 1.5 eV and the other of the p-type semiconductor and the n-type semiconductor may have an energy bandgap of greater than about 1.5 eV. For example, the n-type semiconductor may have an energy bandgap of about 1.0 eV to about 1.5 eV and the p-type semiconductor may have an energy bandgap of greater than about 1.5 eV.

For example, one of the p-type semiconductor and the n-type semiconductor (e.g., a second semiconductor) may have an energy bandgap of about 1.0 eV to about 1.5 eV and the other of the p-type semiconductor and the n-type semiconductor (e.g., a first semiconductor) may have an energy bandgap of about 1.7 eV to about 2.3 eV. For example, the n-type semiconductor may have an energy bandgap of about 1.0 eV to about 1.5 eV and the p-type semiconductor may have an energy bandgap of about 1.7 eV to about 2.3 eV.

For example, one of the p-type semiconductor and the n-type semiconductor may have a LUMO energy level of about 3.5 eV to about 5.5 eV and a HOMO energy level of about 4.5 eV to about 7.0 eV and the other of the p-type semiconductor and the n-type semiconductor may have a LUMO energy level of about 1.5 eV to about 3.8 eV and a HOMO energy level of about 4.3 eV to about 6.9 eV. For example, the n-type semiconductor may have a LUMO energy level of about 3.5 eV to about 5.5 eV and a HOMO energy level of about 4.5 eV to about 7.0 eV and the p-type semiconductor may have a LUMO energy level of about 1.5 eV to about 3.8 eV and a HOMO energy level of about 4.3 eV to about 6.9 eV.

The p-type semiconductor and the n-type semiconductor may be selected from compounds satisfying the optical properties and electrical characteristics.

For example, one of the p-type semiconductor and the n-type semiconductor may be a visible light absorbing material satisfying the optical properties and electrical characteristics, for example a material having a core structure including an electron donating moiety, a pi conjugation linking group, and an electron accepting moiety. The p-type semiconductor may be an organic semiconductor having a core structure including an electron donating moiety, a pi conjugation linking group, and an electron accepting moiety.

The visible light absorbing material may be for example represented by Chemical Formula 1, but is not limited thereto.

EDG-HA-EAG    [Chemical Formula 1]

In Chemical Formula 1,

HA is a C2 to C30 heterocyclic group having at least one of Se, Te, S, and Si,

EDG is an electron-donating group, and

EAG is an electron accepting group.

For example, the light absorbing material represented by Chemical Formula 1 may be for example represented by Chemical Formula 1A or 1B.

[Chemical Formula 1A]

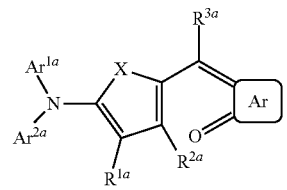

In Chemical Formula 1A,

X is S, Se, Te, SO, $SO_2$, or $SiR^aR^b$,

Ar is a substituted or unsubstituted C6 to C30 arylene group, a substituted or unsubstituted C3 to C30 heterocyclic group, or a fused ring of the foregoing two or more, $Ar^{1a}$ and $Ar^{2a}$ are independently a substituted or unsubstituted C6 to C30 aryl group or a substituted or unsubstituted C3 to C30 heteroaryl group, $Ar^{1a}$ and $Ar^{2a}$ are independently present alone or are linked with each other to form a fused ring, and $R^{1a}$ to $R^{3a}$, $R^a$, and $R^b$ are independently hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group,

[Chemical Formula 1B]

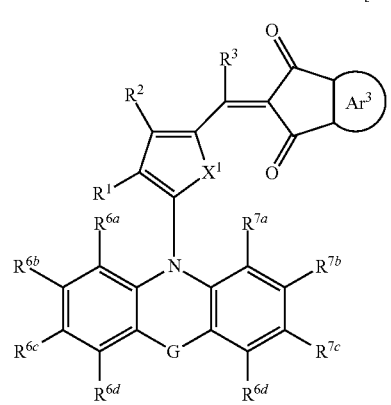

wherein, in Chemical Formula 1B, $X^1$ is Se, Te, O, S, SO, or $SO_2$, $Ar^3$ is a substituted or unsubstituted C6 to C30 arylene group, a substituted or unsubstituted C3 to C30 heterocyclic group, or a fused ring of the foregoing two or more, $R^1$ to $R^3$ are independently one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G is one of a single bond, —O—, —S—, —Se—, —N=, —(CR$^f$R$^g$)$_k$—, —NR$^h$—, —SiR$^i$R$^j$—, —GeR$^k$R$^l$—, —(CR$^m$)=C(R$^n$))—, and SnR$^o$R$^p$, wherein R$^f$, R$^g$, R$^h$, R$^i$, R$^j$, R$^k$, R$^l$, R$^m$, R$^n$, R$^o$, and R$^p$ are independently one of hydrogen, a halogen, a substituted or unsubstituted C1 to C10 alkyl group, a substituted or unsubstituted C1 to C10 alkoxy group, and a substituted or unsubstituted C6 to C12 aryl group, R$^f$ and R$^g$, R$^i$ and R$^j$, R$^k$ and R$^l$, R$^m$ and R$^n$, and R$^o$ and R$^p$ are independently present alone or linked with each other to provide a ring, and k is 1 or 2, R$^{6a}$ to R$^{6d}$ and R$^{7a}$ to R$^{7d}$ are independently one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, R$^{6a}$ to R$^{6d}$ are independently present alone or adjacent two thereof are linked with each other to form a fused ring, and R$^{7a}$ to R$^{7d}$ are independently present alone or adjacent two thereof are linked with each other to form a fused ring.

For example, in Chemical Formula 1A, Ar$^{1a}$ and Ar$^{1a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

For example, Ar$^{1a}$ and Ar$^{2a}$ of Chemical Formula 1A may be linked with each other to form a ring or for example, Ar$^{1a}$ and Ar$^{2a}$ may be linked with each other by one of a single bond, —(CR$^g$R$^h$)$_{n2}$— (n2 is 1 or 2), —O—, —S—, —Se—, —N=, —NR$^i$—, —Si$^j$R$^k$—, and —GeR$^l$R$^m$— to form a ring. Herein, R$^g$ to R$^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the visible light absorbing material represented by Chemical Formula 1A may be for example represented by one of Chemical Formulae 1A-1 to 1A-4, but is not limited thereto.

[Chemical Formula 1A-1]

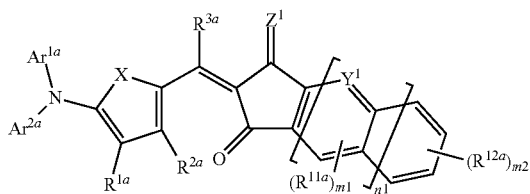

[Chemical Formula 1A-2]

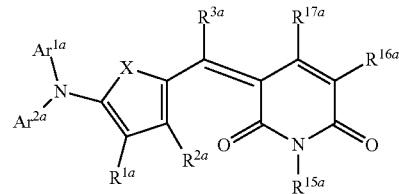

[Chemical Formula 1A-3]

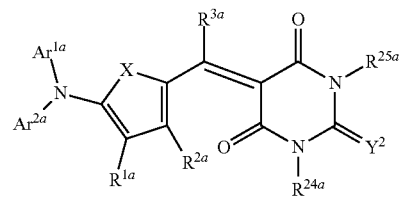

[Chemical Formula 1A-4]

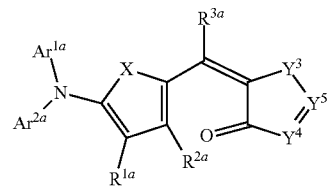

In Chemical Formulae 1A-1 to 1A-4,

X, Ar$^{1a}$, Ar$^{2a}$, and R$^{1a}$ to R$^{3a}$ are the same as described above, Z$^1$ is O or CR$^c$R$^d$, Y$^1$ is N or CR$^e$, Y$^2$ is one of O, S, Se, Te, and C(R$^f$)(CN), Y$^3$ is O, S, Se, or Te, Y$^4$ is N or NR$^{18a}$, Y$^5$ is CR$^{19a}$ or C=CR$^{20a}$(CN), R$^{11a}$, R$^{12a}$, R$^{15a}$ to R$^{20a}$, R$^{24a}$, R$^{25a}$, and R$^a$ to R$^f$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group, n1 is 0 or 1, m1 is 0 or 1, and m2 is an integer of 0 to 4.

For example, Ar$^3$ of Chemical Formula 1B may be benzene, naphthylene, anthracene, thiophene, selenophene, tellurophene, pyridine, pyrimidine, or a fused ring of the foregoing two or more.

For example, the other of the p-type semiconductor and the n-type semiconductor may be an infrared light absorbing material satisfying the aforementioned optical properties and electrical characteristics. The infrared light absorbing material is not particularly limited as long as the optical properties and electrical characteristics is satisfied and may be for example one of a quantum dot, a quinoid compound, a cyanine compound, a phthalocyanine compound, a naphthalocyanine compound, an immonium compound, a diimmonium compound, a triarylmethane compound, a pyrromethene compound, a dipyrromethene compound, a quinone compound, a diquinone compound, a naphthoquinone compound, an anthraquinone compound, a squarylium compound, a rylene compound, a perylene compound, a squaraine compound, a bisthiolene compound, a merocyanine compound, a diketopyrrolopyrrole compound, a croconium compound, a benzothiadiazine compound, a bisbenzothiadiazine compound, derivatives thereof, a (semi)metal complex compound thereof, or a combination thereof, but is not limited thereto. Herein each compound may be substituted or unsubstituted. For example, the infrared light absorbing material is described in Japanese patent No. 5,216,279; Japanese patent laid-open publication No. 1989-0069686; U.S. Pat. No. 8,231,471; Adv. Appl. Sci. Res., 2014, 5 2 p. 111-116; Organic Electronics 12 2011 p. 34-38; Adv. Mater, 2008, 20, p. 2556-2560; and J, Am, Chem, Soc, 2003, 125, 348.

For example, the p-type semiconductor may be the visible light absorbing material and the n-type semiconductor may be the infrared light absorbing material.

The photoelectric conversion layer 30 may be an intrinsic layer (an I layer) wherein the p-type semiconductor and the n-type semiconductor are mixed as a bulk heterojunction. Herein, the p-type semiconductor and the n-type semiconductor may be mixed in a volume ratio of about 1:9 to about 9:1, within the range, for example, in a volume ratio of about 2:8 to about 8:2, about 3:7 to about 7:3, about 4:6 to about 6:4, or about 5:5. For example, the p-type semiconductor may be included in the same volume ratio as or in a greater volume ratio than the n-type semiconductor and for example the p-type semiconductor and the n-type semiconductor may be for example mixed in a volume ratio of about 1:1 to about 3:1, for example about 1:1 to about 2:1

The photoelectric conversion layer 30 may be a bilayer including a p-type layer including the p-type semiconductor and an n-type layer including the n-type semiconductor. Herein, each thickness of the p-type layer and the n-type layer may be about 1:9 to about 9:1, for example about 2:8 to about 8:2, about 3:7 to about 7:3, about 4:6 to about 6:4, or about 5:5.

For example, the photoelectric conversion layer 30 may not include fullerene or a fullerene derivative in addition to the p-type semiconductor and the n-type semiconductor. Accordingly, abnormal light absorption in a short wavelength spectrum of light of visible ray which may occur when the fullerene or the fullerene derivative is used as a p-type or n-type semiconductor may be reduced and thus wavelength selectivity in the center of the peak absorption wavelength may be improved.

The light absorption characteristics of photoelectric conversion layer 30 may be expressed by a combination of light absorption characteristics of the p-type semiconductor and the n-type semiconductor. In some example embodiments, as described above, one of the p-type semiconductor and the n-type semiconductor may be a visible light absorbing material and the other of the p-type semiconductor and the n-type semiconductor may be an infrared light absorbing material and therefore light absorption characteristics of the photoelectric conversion layer 30 in a visible wavelength spectrum of light may be determined by a visible light absorbing material. Accordingly, abnormal light absorption in a short wavelength spectrum of light of visible ray which may occur when the fullerene or the fullerene derivative having high light absorption characteristics around about 450 nm is used as a p-type or n-type semiconductor may be reduced and thus wavelength selectivity in the center of the peak absorption wavelength of the visible light absorbing material may be improved.

For example, when the p-type semiconductor is a visible light absorbing material to selectively absorb light in a wavelength spectrum of light of about 500 nm to about 600 nm and the n-type semiconductor is the infrared light absorbing material, light absorption characteristics of the photoelectric conversion layer 30 may be determined by the p-type semiconductor and thus a photoelectric device having desirable wavelength selectivity may be realized. On the contrary, when the p-type semiconductor is a visible light absorbing material to selectively absorb light in a wavelength spectrum of light of about 500 nm to about 600 nm and the n-type semiconductor is fullerene, light absorption characteristics of the photoelectric conversion layer 30 is deformed by light absorption of fullerene at around about 450 nm and wavelength selectivity may be deteriorated due to a wide full width at half maximum (FWHM). Herein, the full width at half maximum (FWHM) is a width of a wavelength corresponding to a half of a peak light absorption point or peak photoelectric conversion efficiency. As used herein, when specific definition is not otherwise provided, it may be defined with a reference to an absorbance measured with UV-Vis spectroscopy. When the light-absorption FWHM is narrow, light in a narrow wavelength spectrum of light is selectively absorbed, which means that wavelength selectivity is high.

For example, wavelength selectivity of the photoelectric conversion layer 30 may be expressed by a ratio of external quantum efficiency ($EQE_{max}$) at a peak absorption wavelength ($\lambda_{max}$) and external quantum efficiency ($EQE_o$) at other wavelengths and as the external quantum efficiency ($EQE_o$) at other wavelengths relative to the external quantum efficiency ($EQE_{max}$) at the peak absorption wavelength is larger, wavelength selectivity may be lowered.

For example, when the peak absorption wavelength belongs to about 500 nm to about 600 nm, the wavelength selectivity of the photoelectric conversion layer 30 may be expressed by a ratio ($EQE_{450\ nm}/EQE_{max}$) of the external quantum efficiency ($EQE_{450\ nm}$) at a wavelength of 450 nm relative to the external quantum efficiency ($EQE_{max}$) at the peak absorption wavelength ($\lambda_{max}$). For example, a ratio ($EQE_{450\ nm}/EQE_{max}$) of the external quantum efficiency when the p-type semiconductor is a visible light absorbing material that selectively absorbs light in a wavelength spectrum of light of about 500 nm to about 600 nm and the n-type semiconductor is the infrared light absorbing material may be smaller than a ratio ($EQE_{450\ nm}/EQE_{max}$) of the external quantum efficiency when the p-type semiconductor is a visible light absorbing material that selectively absorbs light in a wavelength spectrum of light of about 500 nm to about 600 nm and the n-type semiconductor is fullerene.

For example, a ratio ($EQE_{450\ nm}/EQE_{max}$) of the external quantum efficiency at 450 nm relative to external quantum efficiency at a peak absorption wavelength of the photoelectric conversion layer 30 may be less than or equal to about 0.30, less than or equal to about 0.28, less than or equal to about 0.25, less than or equal to about 0.23, less than or equal to about 0.20, less than or equal to about 0.18.

In some example embodiments, the photoelectric conversion layer 30 is configured to the photoelectric conversion layer is configured to selectively absorb green light having a peak absorption wavelength in a the wavelength spectrum of about 520 nm to about 580 nm, and a ratio (EQE450 nm/EQE max) of external quantum efficiency (EQE450 nm) at 450 nm relative to external quantum efficiency (EQE max) at a the peak absorption wavelength of the photoelectric conversion layer is less than or equal to about 0.30.

For example, the photoelectric conversion layer 30 may have a full width at half maximum (FWHM) of less than or equal to about 120 nm, within the range, about 50 nm to about 120 nm, about 50 nm to about 115 nm, about 50 nm to about 110 nm, about 50 nm to about 105 nm, or about 50 nm to about 100 nm.

The photoelectric device 100 may further include an anti-reflection layer (not shown) on the first electrode 10 or the second electrode 20. The anti-reflection layer is disposed at a light incidence side and may lower reflectance of light of incident light and thereby light absorbance is further improved. For example, when light enters from the first electrode 10, the anti-reflection layer may be disposed on the first electrode 10 while when light enters from the second electrode 20, the anti-reflection layer may be disposed under the second electrode 20.

The anti-reflection layer may include, for example a material having a refractive index of about 1.6 to about 2.5, and may include for example at least one of a metal oxide, a metal sulfide, and an organic material having a refractive index within the ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

In the photoelectric device 100, when light enters from the first electrode 10 or the second electrode 20 and the photoelectric conversion layer 30 absorbs light in a particular (or, alternatively, predetermined) wavelength spectrum of light, excitons may be produced from the inside. The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Hereinafter, a photoelectric device according to some example embodiments is described.

Figure 2:
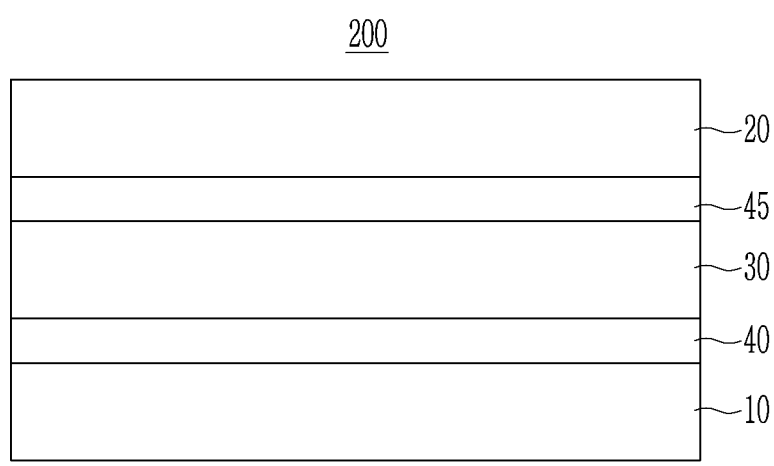
FIG. 2 is a cross-sectional view showing a photoelectric device according to some example embodiments.

FIG. 2 is a cross-sectional view showing a photoelectric device according to some example embodiments.

Referring to FIG. 2, the photoelectric device 200 according to some example embodiments includes a first electrode 10 and a second electrode 20 and a photoelectric conversion layer 30 disposed between the first electrode 10 and the second electrode 20, like some example embodiments. The first electrode 10, the second electrode 20, and the photoelectric conversion layer 30 are the same as described above.

However, the photoelectric device 200 according to some example embodiments further includes each charge auxiliary layer 40 and 45 between the first electrode 10 and the photoelectric conversion layer 30 and the second electrode 20 and the photoelectric conversion layer 30, unlike some example embodiments. The charge auxiliary layers 40 and 45 may make holes and electrons separated in the photoelectric conversion layer 30 be transported easily to improve efficiency.

The charge auxiliary layers 40 and 45 may include at least one selected from a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport.

The charge auxiliary layers 40 and 45 may include for example an organic material, an inorganic material, or an organic/inorganic material. The organic material may be an organic material having hole or electron characteristics and the inorganic material may be for example a metal oxide such as a molybdenum oxide, a tungsten oxide, or a nickel oxide. One or more of the charge auxiliary layers 40 and 45 may have an energy bandgap of greater than or equal to about 2.8 eV.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

At least one of the charge auxiliary layers 40 and 45 may not absorb light in a visible ray region substantially and may include for example a visible light non-absorbing material.

The visible light non-absorbing material may be for example a material that does not absorb light in a visible ray region substantially and may be for example visible light non-absorbing organic material. The visible light non-absorbing material may be for example a charge buffer material, for example a hole buffer material or an electron buffer material, for example a hole injection material, a hole transport material, a hole blocking material, an electron injecting material, an electron transport material, or an electron blocking material.

For example, the visible light non-absorbing material may have an energy bandgap of greater than or equal to about 2.8 eV, for example greater than or equal to about 3.0 eV. The visible light non-absorbing material may have for example an energy bandgap of about 2.8 eV to about 4.0 eV, for example about 3.0 eV to about 3.8 eV.

For example, the visible light non-absorbing material may have for example a HOMO energy level of about 5.4 eV to about 5.8 eV, for example about 5.50 eV to about 5.75 eV.

For example, the visible light non-absorbing material may be a compound represented by Chemical Formula 2A or 2B, but is not limited thereto.

[Chemical Formula 2A]

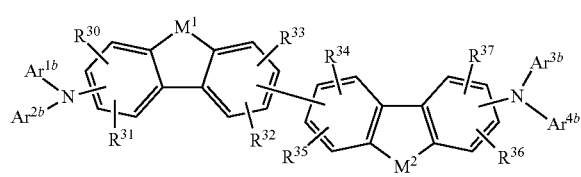

-continued

[Chemical Formula 2B]

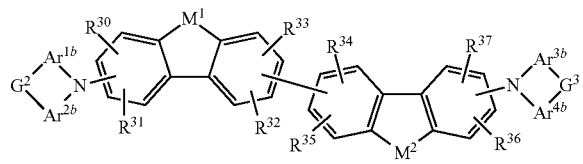

In Chemical Formula 2A or 2B, $M^1$ and $M^2$ are independently $CR''R^o$, $SiR^pR^o$, $NR^r$, O, S, Se, or Te, $Ar^{1b}$, $Ar^{2b}$, $Ar^{3b}$, and $Ar^{4b}$ are independently a substituted or unsubstituted C6 to C30 aryl group or a substituted or unsubstituted C3 to C30 heteroaryl group, $G^2$ and $G^3$ are independently a single bond, —$(CR^sR^t)_{n3}$—, —O—, —S—, —Se—, —N=, —$NR^u$—, —$SiR^vR^w$—, or —$GeR^xR^y$—, wherein n3 is 1 or 2, and $R^{30}$ to $R^{37}$ and $R^n$ to $R^y$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

For example, the visible light non-absorbing material may be a compound represented by Chemical Formula 2A-1 or 2B-1, but is not limited thereto.

[Chemical Formula 2A-1]

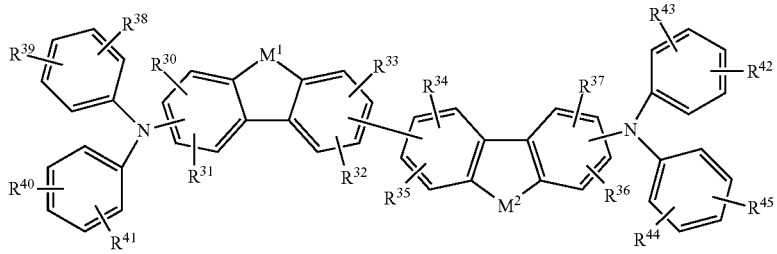

[Chemical Formula 2B-1]

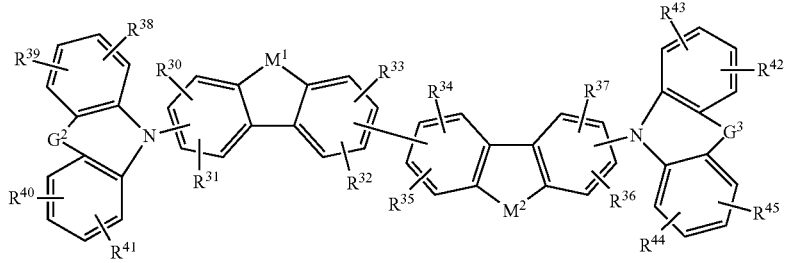

In Chemical Formula 2A-1 or 2B-1, $M^1$, $M^2$, $G^2$, $G^3$, and $R^{30}$ to $R^{37}$ are the same as described above, $R^{38}$ to $R^{45}$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the visible light non-absorbing material may be a compound represented by Chemical Formula 2A-1a or 2B-1 a, but is not limited thereto.

[Chemical Formula 2A-1a]

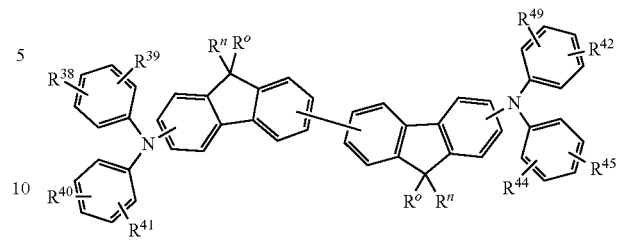

[Chemical Formula 2B-1a]

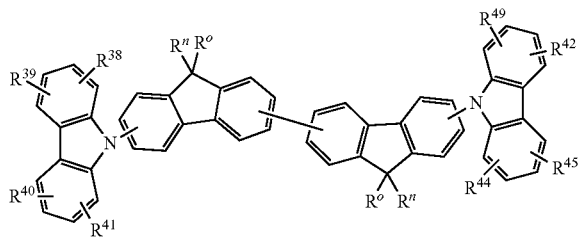

In Chemical Formula 2A-1a or 2B-1a, $R^{38}$ to $R^{45}$ and $R^o$ and $R^n$ are the same as described above.

Each thickness of the charge auxiliary layers 40 and 45 may be for example about 1 nm to about 20 nm.

Either one of the charge auxiliary layers 40 and 45 may be omitted.

The photoelectric device may be applied to an image sensor, a photodetector, a photosensor, and an organic light emitting diode (OLED), and the like, but is not limited thereto.

The photoelectric device may be for example applied to an image sensor.

Hereinafter, an example of an image sensor including the photoelectric device is described referring to drawings. As an example of an image sensor, an organic CMOS image sensor is described.

Figure 3:
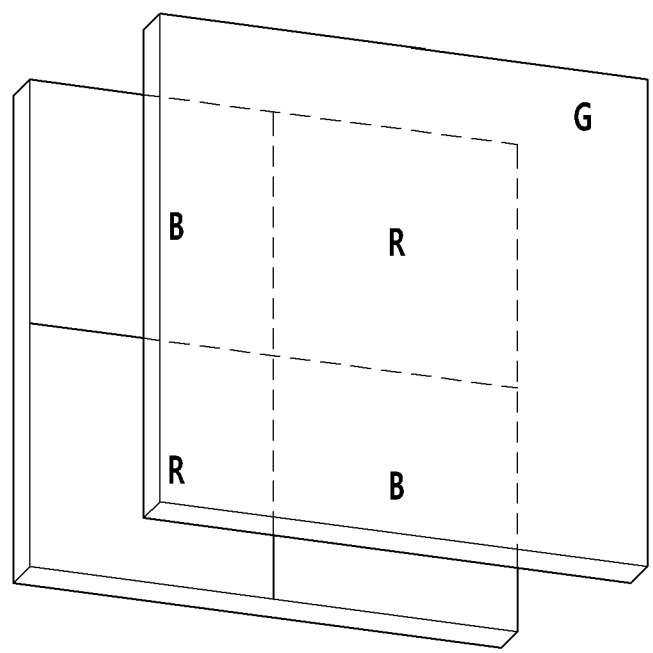
FIG. 3 is a schematic top plan view showing an organic CMOS image sensor according to some example embodiments.
Figure 4:
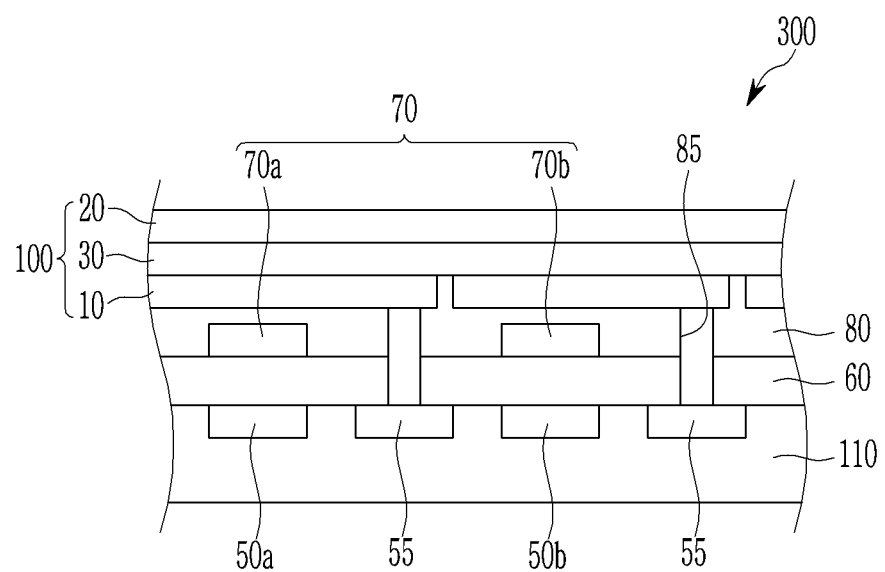
FIG. 4 is a cross-sectional view showing one example of the organic CMOS image sensor of FIG. 3.

FIG. 3 is a schematic top plan view of an organic CMOS image sensor according to some example embodiments and FIG. 4 is a cross-sectional view showing one example of the organic CMOS image sensor of FIG. 3.

Referring to FIGS. 3 and 4, an organic CMOS image sensor 300 according to some example embodiments includes a semiconductor substrate 110 integrated with photo-sensing devices 50a and 50b, a transmission transistor (not shown) and a charge storage 55, a lower insulation layer 60, a color filter layer 70, an upper insulation layer 80, and a photoelectric device 100.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the photoelectric device 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing device 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 includes a blue filter 70a formed in a blue pixel and a red filter 70b in a red pixel. In some example embodiments, a green filter is not included, but a green filter may be further included.

The upper insulation layer 80 is formed on the color filter layer 70. The upper insulation layer 80 may eliminate a step caused by the color filter layer 70 and smoothen the surface. The upper insulation layer 80 and the lower insulation layer 60 may include a contact hole (not shown) exposing a pad, and a through-hole 85 exposing the charge storage 55 of the green pixel.

The photoelectric device 100 is formed on the upper insulation layer 80. The photoelectric device 100 includes the first electrode 10, the photoelectric conversion layer 30, and the second electrode 20 as described above. In the drawing, the first electrode 10, the photoelectric conversion layer 30, and the second electrode 20 are sequentially stacked (e.g., one of the elements is "on" another one of the elements), but this disclosure is not limited thereto, and for example they may be stacked in an order of the second electrode 20, the photoelectric conversion layer 30, and the first electrode 10. As referred to herein, an element that is "on" another element may be directly or indirectly on the other element, above or below the other element, some combination thereof, or the like.

The first electrode 10 and the second electrode 20 may be all light-transmitting electrodes and the photoelectric conversion layer 30 is the same as described above. The photoelectric conversion layer 30 may for example selectively absorb light in a green wavelength spectrum of light and may replace a color filter of a green pixel.

Light in a green wavelength spectrum of light of light that enters from the second electrode 20 is mainly absorbed by the photoelectric conversion layer 30 and photoelectrically converted and light in a remaining wavelength spectrum of light is transmitted through the first electrode 10 and is sensed by the photo-sensing devices 50a and 50b.

An infrared ray cut filter (not shown) may be disposed on the photoelectric device 100.

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

As described above, the photoelectric device 100 has a stack structure thereby a size of an image sensor may be reduced to realize a down-sized image sensor.

In addition, as described above, wavelength selectivity required for the image sensor may be satisfied by including the photoelectric device 100 including the photoelectric conversion layer 30 having high wavelength selectivity. Accordingly, crosstalk may be decreased and thus an image sensor having good sensitivity may be realized.

FIG. 4 exemplarily shows a structure that the photoelectric device of FIG. 1 is stacked, but the photoelectric device of FIG. 2 may be equally applied thereto.

Figure 5:
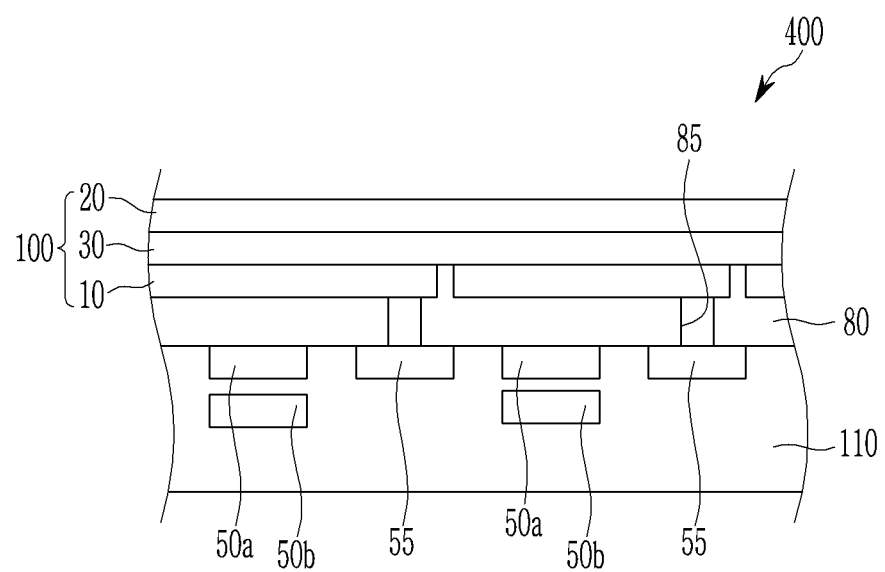
FIG. 5 is a cross-sectional view showing another example of the organic CMOS image sensor.

FIG. 5 is a cross-sectional view showing another example of the organic CMOS image sensor.

The organic CMOS image sensor 400 according to some example embodiments includes a semiconductor substrate 110 integrated with photo-sensing devices 50a and 50b, a transmission transistor (not shown), and a charge storage 55, an upper insulation layer 80 having a through-hole 85, and a photoelectric device 100, like some example embodiments.

However, in the organic CMOS image sensor 400 according to some example embodiments unlike some example embodiments, the photo-sensing devices 50a and 50b are stacked in a vertical direction, but the color filter layer 70 is omitted. The photo-sensing devices 50a and 50b are electrically connected to charge storage (not shown) and may be transferred by the transmission transistor. The photo-sensing devices 50a and 50b may selectively absorb light in each wavelength spectrum of light depending on a stacking depth.

An infrared ray cut filter (not shown) may be disposed on the photoelectric device 100.

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

As described above, the photoelectric device configured to selectively absorb light in a green wavelength spectrum of light has a stack structure and the red photo-sensing device and the blue photo-sensing device are stacked and thus the size of an image sensor may be reduced to realize a down-sized image sensor.

FIG. 5 exemplarily shows a structure that the photoelectric device of FIG. 1 is stacked, but the photoelectric device of FIG. 2 may be equally applied thereto.

Figure 6:
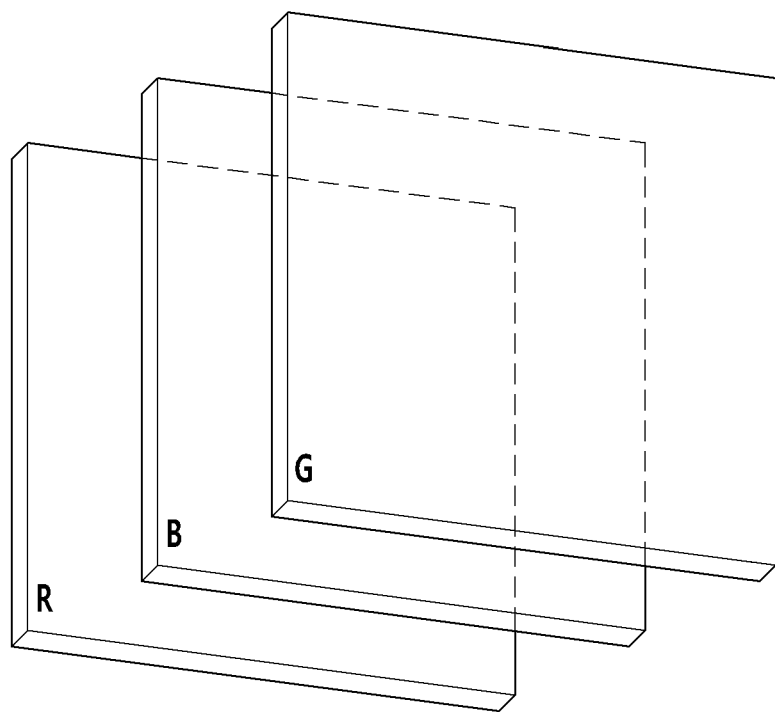
FIG. 6 is a schematic top plan view showing an organic CMOS image sensor according to some example embodiments.
Figure 7:
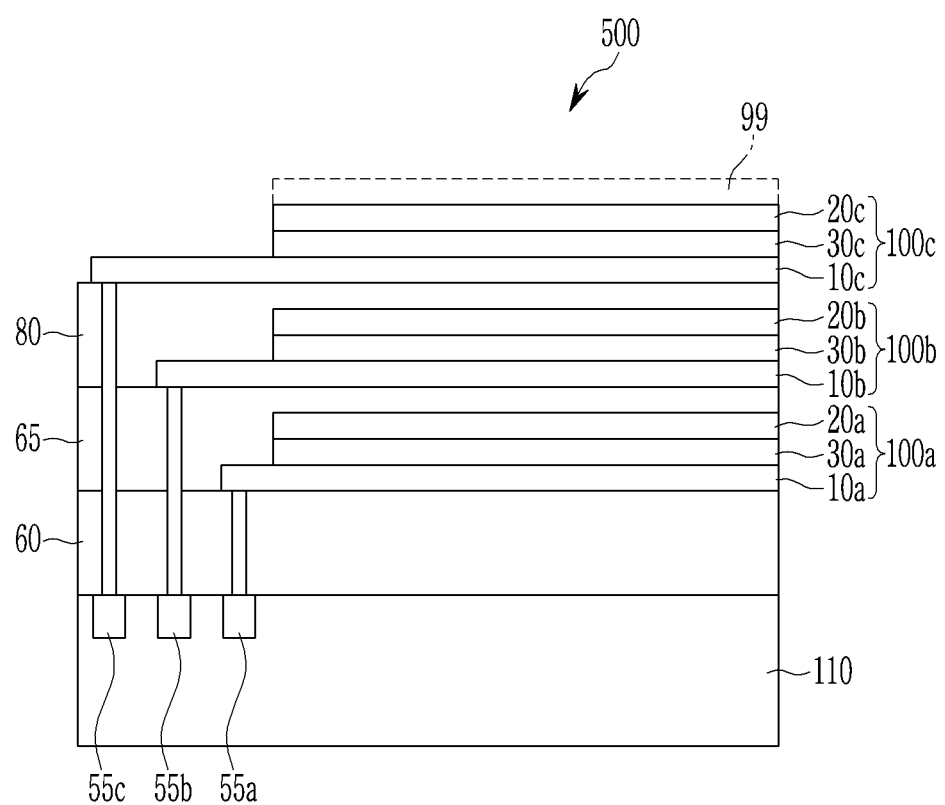
FIG. 7 is a cross-sectional view showing the organic CMOS image sensor of FIG. 6.

FIG. 6 is a schematic top plan view of an organic CMOS image sensor according to some example embodiments and FIG. 7 is a cross-sectional view of the organic CMOS image sensor of FIG. 6.

The organic CMOS image sensor 500 according to some example embodiments includes a green photoelectric device configured to selectively absorb light in a green wavelength spectrum of light, a blue photoelectric device configured to selectively absorb light in a blue wavelength spectrum of light, and a red photoelectric device configured to selectively absorb light in a green wavelength spectrum of light, and they are stacked.

The organic CMOS image sensor 500 according to some example embodiments includes a semiconductor substrate 110, a lower insulation layer 60, an intermediate insulation layer 65, an upper insulation layer 80, a first photoelectric device 100a, a second photoelectric device 100b, and a third photoelectric device 100c.

The first photoelectric device 100a may be configured to convert first visible light into a first electric signal, the first visible light being one of blue light, green light, and red light. The second photoelectric device 100b may be on the first photoelectric device 100a and may be configured to convert second visible light into a second electric signal, the second visible light being one of blue light, green light, and red light into an electric signal. The third photoelectric device 100c may be on the second photoelectric device 100b and may be configured to convert third visible light into a third electric signal, the third visible light being one of blue light, green light, and red light. The first visible light, the second visible light, and the third visible light may be different from each other.

The semiconductor substrate 110 may be a silicon substrate, and is integrated with the transmission transistor (not shown) and the charge storages 55a, 55b, and 55c.

A metal wire (not shown) and a pad (not shown) are formed on the semiconductor substrate 110, and the lower insulation layer 60 is formed on the metal wire and the pad.

The first photoelectric device 100a is formed on the lower insulation layer 60.

The first photoelectric device 100a includes a first electrode 10a and a second electrode 20a facing each other and a photoelectric conversion layer 30a between the first electrode 10a and the second electrode 20a. The first electrode 10a, the second electrode 20a, and the photoelectric conversion layer 30a are the same as described above and the photoelectric conversion layer 30a may selectively absorb light in one of red, blue, and green wavelength spectrum of lights. For example, the first photoelectric device 100a may be a red photoelectric device.

In the drawing, the first electrode 10a, the photoelectric conversion layer 30a, and the second electrode 20a are sequentially stacked, but this disclosure is not limited thereto, and for example they may be stacked in an order of the second electrode 20a, the photoelectric conversion layer 30a, and the first electrode 10a.

An intermediate insulation layer 65 is formed on the first photoelectric device 100a.

The second photoelectric device 100b is formed on the intermediate insulation layer 65.

The second photoelectric device 100b includes a first electrode 10b and a second electrode 20b facing each other and a photoelectric conversion layer 30b between the first electrode 10b and the second electrode 20b. The first electrode 10b, the second electrode 20b, and the photoelectric conversion layer 30b may be described above and the photoelectric conversion layer 30b may selectively absorb light in one of red, blue, and green wavelength spectrum of lights. For example, the second photoelectric device 100b may be a blue photoelectric device.

In the drawing, the first electrode 10b, the photoelectric conversion layer 30b, and the second electrode 20b are sequentially stacked, but this disclosure is not limited thereto, and for example they may be stacked in an order of the second electrode 20b, the photoelectric conversion layer 30b, and the first electrode 10b.

The upper insulation layer 80 is formed on the second photoelectric device 100b. The lower insulation layer 60, the intermediate insulation layer 65, and the upper insulation layer 80 have a plurality of through-holes exposing the charge storages 55a, 55b, and 55c.

The third photoelectric device 100c is formed on the upper insulation layer 80. The third photoelectric device 100c includes a first electrode 10c and a second electrode 20c facing each other and a photoelectric conversion layer 30c between the first electrode 10c and the second electrode 20c. The first electrode 10c, the second electrode 20c, and the photoelectric conversion layer 30c are the same as described above and the photoelectric conversion layers 30c may selectively absorb light in one of red, blue, and green wavelength spectrum of lights. For example, the third photoelectric device 100c may be a green photoelectric device and the photoelectric device 100 may be applied.

In the drawing, the first electrode 10c, the photoelectric conversion layer 30c, and the second electrode 20c are sequentially stacked, but this disclosure is not limited thereto, and for example they may be stacked in an order of the second electrode 20c, the photoelectric conversion layer 30c, and the first electrode 10c.

An infrared ray cut filter 99 (also referred to as an infrared filter) may be disposed on one surface of the photoelectric device 100c.

Focusing lens (not shown) may be further formed on the photoelectric device 100c. The focusing lens may control a direction of incident light and gather the light in one region. The focusing lens may have a shape of, for example, a cylinder or a hemisphere, but is not limited thereto.

In the drawing, as the first photoelectric device 100a, the second photoelectric device 100b, and the third photoelectric device 100c, the photoelectric device of FIG. 1 is exemplified but the photoelectric device of FIG. 2 may be applied in the same manner.

In the drawing, the first photoelectric device 100a, the second photoelectric device 100b, and the third photoelectric device 100c are sequentially stacked, but the present disclosure is not limited thereto, and they may be stacked in various orders.

As described above, the first photoelectric device 100a, the second photoelectric device 100b, and the third photoelectric device 100c have a stack structure, and thus the size of an image sensor may be reduced to realize a down-sized image sensor.

Figure 8:
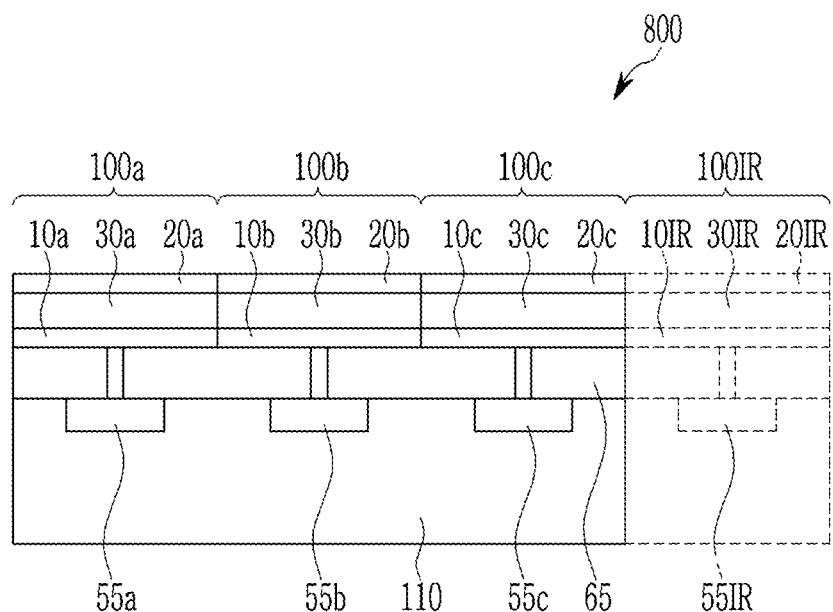
FIG. 8 is a schematic cross-sectional view showing an organic CMOS image sensor according to some example embodiments.

FIG. 8 is a schematic cross-sectional view showing an organic CMOS image sensor according to some example embodiments.

As shown with reference to FIG. 8, an organic CMOS image sensor 800 may include a plurality of photoelectric devices 100a, 100b, and 100c on a semiconductor substrate 110, where the plurality of photoelectric devices 100a, 100b, and 100c are configured to convert different ones of blue light, green light, or red light into electric signals, respectively. As further shown in FIG. 8, the organic CMOS image sensor 800 may further include an infrared/near-infrared photoelectric device 100IR.

Referring to FIG. 8, an organic CMOS image sensor 800 according to some example embodiments includes a semiconductor substrate 110 integrated with an a first charge storage 55a, a second charge storage 55b, a third charge storage 55c, optionally an infrared light/near infrared light charge storage 55IR, and a transmission transistor (not shown), an intermediate insulation layer 65, a first (e.g., blue) photoelectric device 100a, a second (e.g., green) photoelectric device 100b, a third (e.g., red) photoelectric device 100c, and optionally an infrared/near infrared photoelectric device 100IR.

The semiconductor substrate 110 may be a silicon substrate and may be integrated with the first charge storage 55a, the second charge storage 55b, the third charge storage 55c, optionally the infrared light/near infrared light charge storage 55IR, and the transmission transistor (not shown). The first charge storage 55a, the second charge storage 55a, and the third charge storage 55c may be respectively integrated in each of a blue pixel, a green pixel, and a red pixel.

Charges absorbed in the first photoelectric device 100a, the second photoelectric device 100b, and the third photoelectric device 100c, and optionally the infrared/near infrared photoelectric device 100IR, are collected in the first charge storage 55a, the second charge storage 55a, the third charge storage 55c, and optionally the infrared light/near infrared light charge storage 55IR, which are electrically connected to each of the first photoelectric device 100a, the second photoelectric device 100b, and the third photoelectric device 100c, and optionally the infrared/near infrared photoelectric device 100IR.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto.

The intermediate insulation layer 65 may be formed on the metal wires and pads. The intermediate insulation layer 65 may be made of an inorganic insulation material such as a silicon oxide and/or a silicon nitride, or a low dielectric constant (low K) material such as SiC, SiCOH, SiCO, and SiOF.

The first photoelectric device 100a, the second photoelectric device 100b, the third photoelectric device 100c, and the infrared/near infrared photoelectric device 100IR may be formed on the intermediate insulation layer 65. The first photoelectric device 100a includes a first electrode 10a, a second electrode 20a, and a photoelectric conversion layer 30a selectively absorbing light in a first (e.g., blue) wavelength spectrum of light, the second photoelectric device 100b includes a first electrode 10b, a second electrode 20b and a photoelectric conversion layer 30b selectively absorbing light in a second (e.g., green) wavelength spectrum of light, the third photoelectric device 100c includes a first electrode 10c, a second electrode 20c, and a photoelectric conversion layer 30c selectively absorbing light in a third (e.g., red) wavelength spectrum of light, and the infrared/near infrared photoelectric device 100IR includes a first electrode 10IR, a second electrode 20IR, and a photoelectric conversion layer 30IR selectively absorbing light in an infrared/near infrared wavelength spectrum of light.

The first electrodes 10a, 10b, 10c, and 10IR and the second electrodes 20a, 20b, 20c, and 20IR may be light-transmitting electrodes and may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoelectric conversion layers 30a, 30b, 30c, and 30IR may include a p-type semiconductor material and an n-type semiconductor material. The photoelectric conversion layer 30a of the first photoelectric device 100a may include a p-type semiconductor material selectively absorbing light in a first (e.g., blue) wavelength spectrum of light and an n-type semiconductor material selectively absorbing light in a first (e.g., blue) wavelength spectrum of light, the photoelectric conversion layer 30b of the second photoelectric device 100b may include a p-type semiconductor material selectively absorbing light in a second (e.g., green) wavelength spectrum of light and an n-type semiconductor material selectively absorbing light in a second (e.g., green) wavelength spectrum of light, the photoelectric conversion layer 30c of the third photoelectric device 100c may include a p-type semiconductor material selectively absorbing light in a third (e.g., red) wavelength spectrum of light and an n-type semiconductor material selectively absorbing light in a third (e.g., red) wavelength spectrum of light, and the photoelectric conversion layer 30IR of the infrared/near infrared photoelectric device 100IR may include a p-type semiconductor material selectively absorbing light in an infrared wavelength spectrum of light and an n-type semiconductor material selectively absorbing light in an infrared wavelength spectrum of light.

The infrared/near infrared photoelectric device 100IR may selectively absorb light in an infrared wavelength spectrum of greater than or equal to about 700 nm and less than or equal to about 1300 nm without absorption in a visible wavelength spectrum of light.

Figure 9:
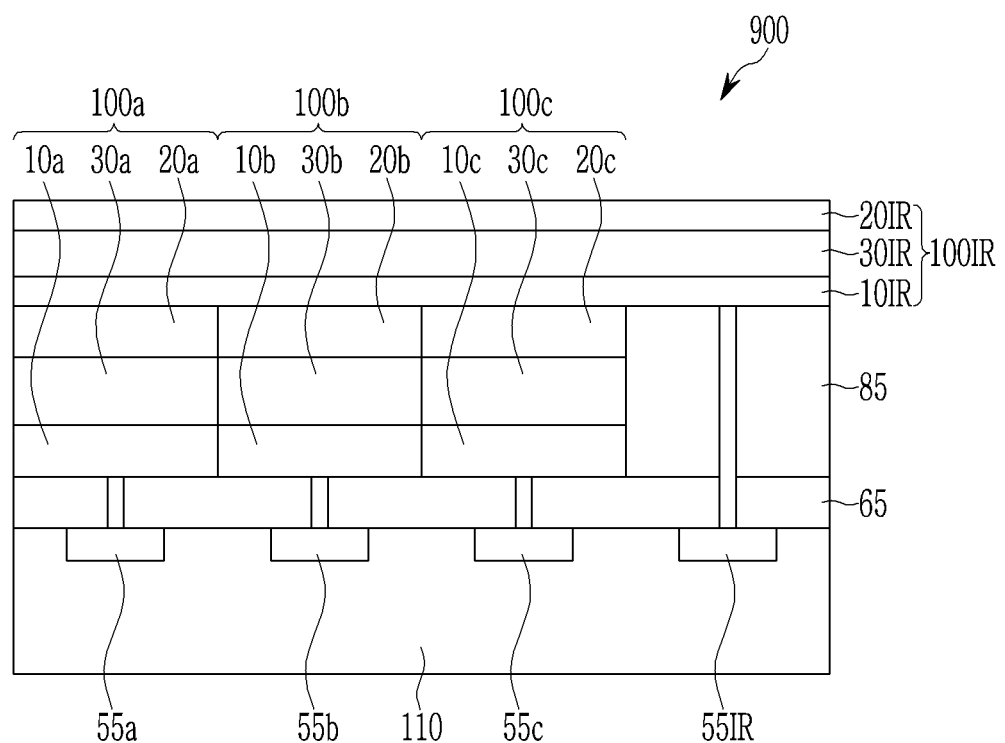
FIGS. 9 and 10 are schematic cross-sectional views of an organic CMOS image sensor according to some example embodiments.
Figure 10:
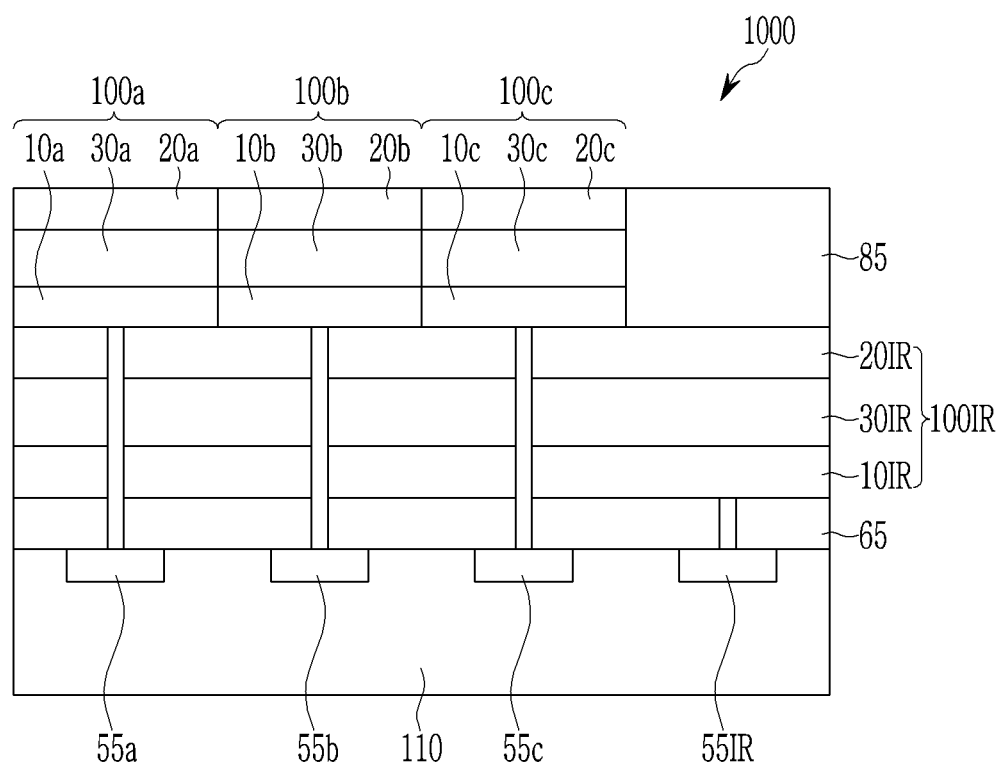

FIGS. 9 and 10 are schematic cross-sectional views of an organic CMOS image sensor according to some example embodiments.

Referring to FIG. 9, an organic CMOS image sensor 900 includes a semiconductor substrate 110 integrated with an infrared light/near infrared light charge storage 55IR, a first charge storage 55a, a second charge storage 55a, a third charge storage 55c, and a transmission transistor (not shown), an intermediate insulation layer 65, a first photoelectric device 100a, a second photoelectric device 100b, a third photoelectric device 100c, and an infrared/near infrared photoelectric device 100IR. The infrared/near infrared photoelectric device 100IR is formed on an entire surface of the first photoelectric device 100a, the second photoelectric device 100b, and the third photoelectric device 100c. Other structures are the same as the image sensor of FIG. 8.

In the structure of FIG. 9, the infrared/near infrared photoelectric device 100IR may be disposed on the intermediate insulation layer 65 and the first photoelectric device 100a, the second photoelectric device 100b, and the third photoelectric device 100c may be disposed thereon. An organic CMOS image sensor 1000 having such a structure is shown in FIG. 10.

The infrared/near infrared photoelectric device 100IR may selectively absorb light in an infrared wavelength spectrum of greater than or equal to about 700 nm and less than or equal to about 1300 nm without absorption in a visible wavelength spectrum of light and may improve efficiency due to a large absorption area.

Figure 11:
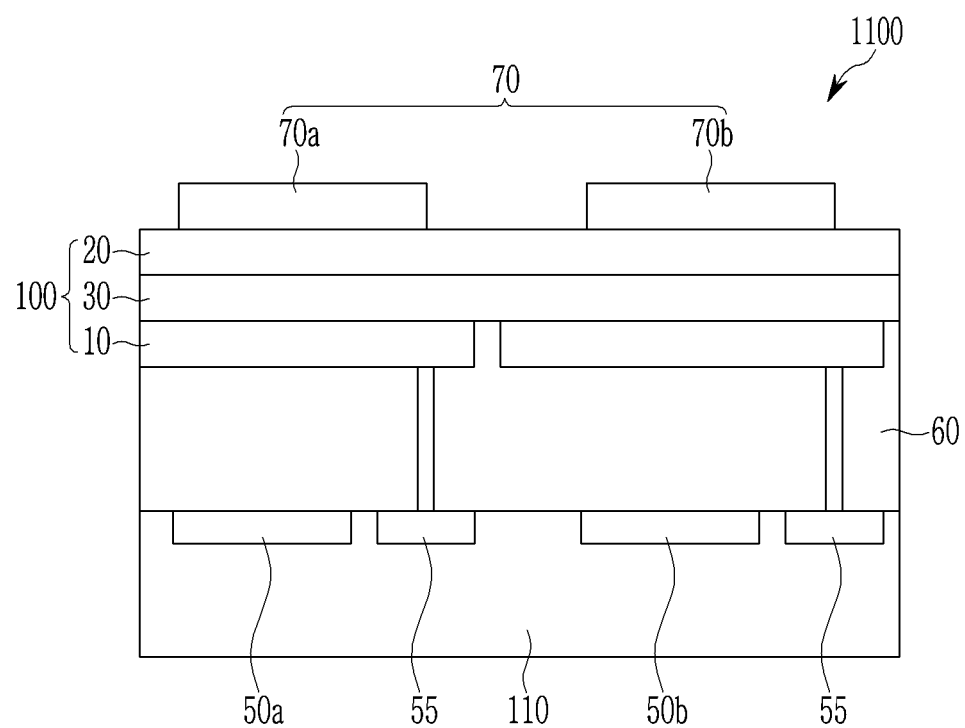
FIG. 11 is a schematic cross-sectional view of an organic CMOS image sensor according to some example embodiments.

FIG. 11 is a schematic cross-sectional view of an organic CMOS image sensor according to some example embodiments.

Referring to FIG. 11, an organic CMOS image sensor 1100 according to some example embodiments includes a semiconductor substrate 110 integrated with photo-sensing devices 50a and 50b, a transmission transistor (not shown) and a charge storage 55, a lower insulation layer 60, a color filter layer 70, an upper insulation layer 80, and a photoelectric device 100. As shown in FIG. 11, the photoelectric device 100 may be between the semiconductor substrate 110 and the color filter layer 70, such that the color filter layer 70 is distal from the photo-sensing device 50a and 50b in relation to the photoelectric device 100. Other structures are the same as the image sensor of FIG. 4.

Figure 12:
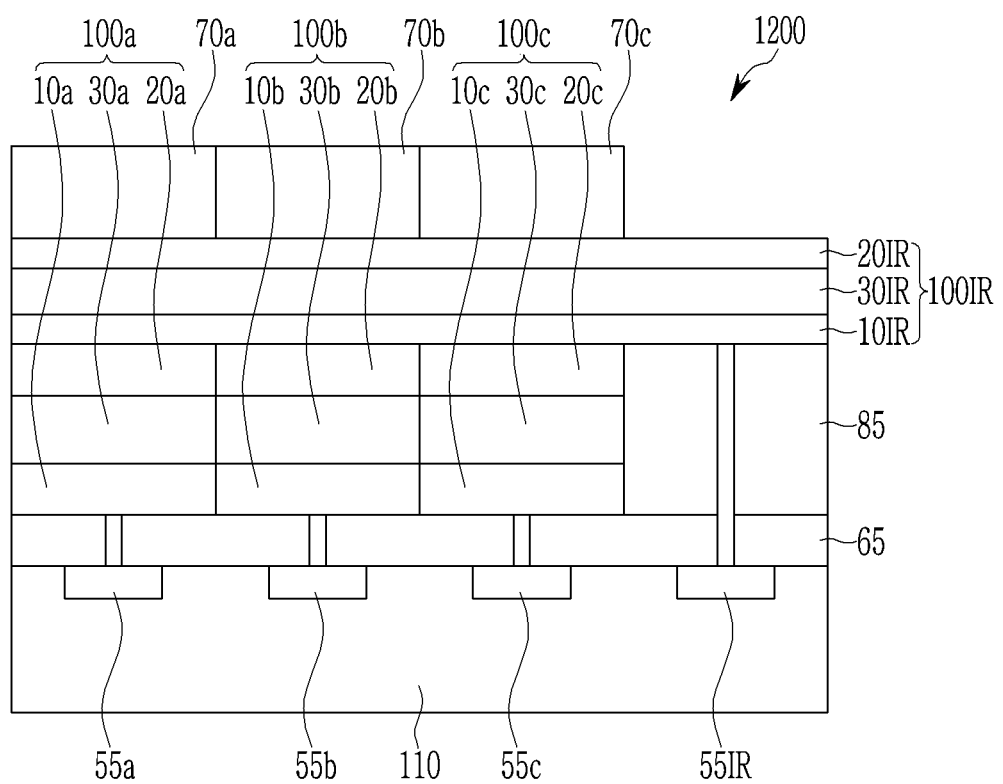
FIG. 12 is a schematic cross-sectional view of an organic CMOS image sensor according to some example embodiments.

FIG. 12 is a schematic cross-sectional view of an organic CMOS image sensor according to some example embodiments.

Referring to FIG. 12, an organic CMOS image sensor 1200 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first photoelectric device 100a, a second photoelectric device 100b, a third photoelectric device 100c, an infrared/near infrared photoelectric device 100IR, a first (e.g., blue) filter 70a, a second (e.g., green) filter 70b, and a third (e.g., red) filter 70c.

Figure 13:
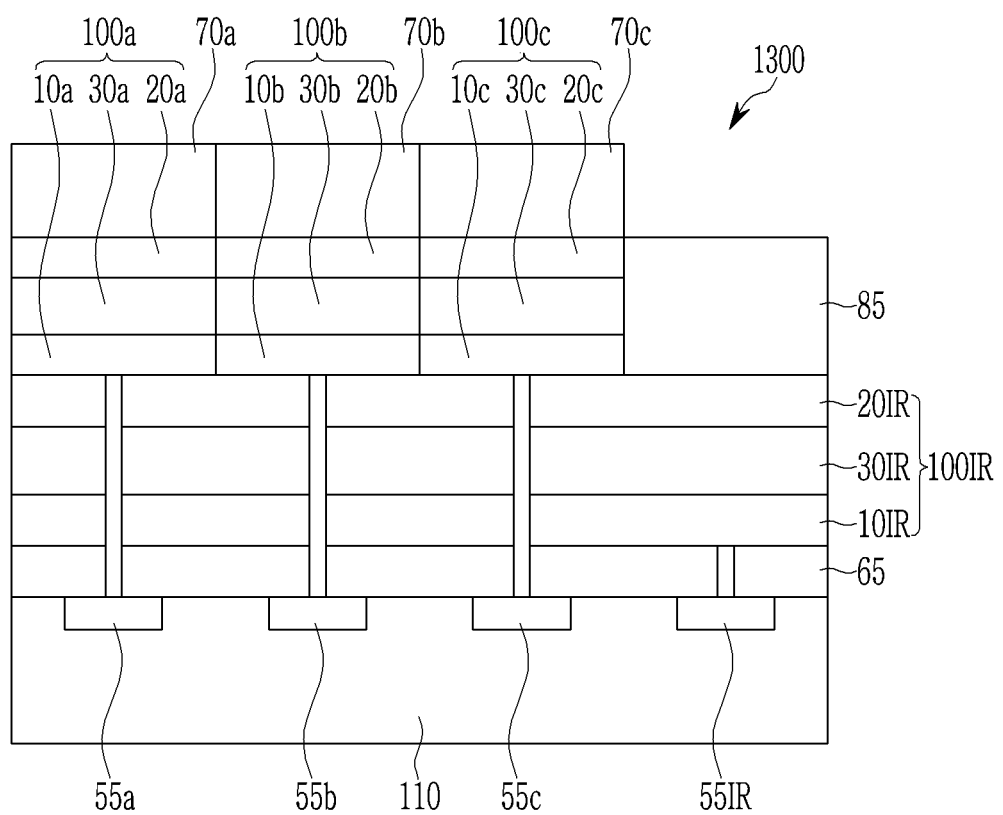
FIG. 13 is a schematic cross-sectional view of an organic CMOS image sensor according to some example embodiments.

FIG. 13 is a schematic cross-sectional view of an organic CMOS image sensor according to some example embodiments.

Referring to FIG. 13, an organic CMOS image sensor 1300 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first photoelectric device 100a, a second photoelectric device 100b, a third photoelectric device 100c, an infrared/near infrared photoelectric device 100IR, a first (e.g., blue) filter 70a, a second (e.g., green) filter 70b, and a third (e.g., red) filter 70c.

Figure 14:
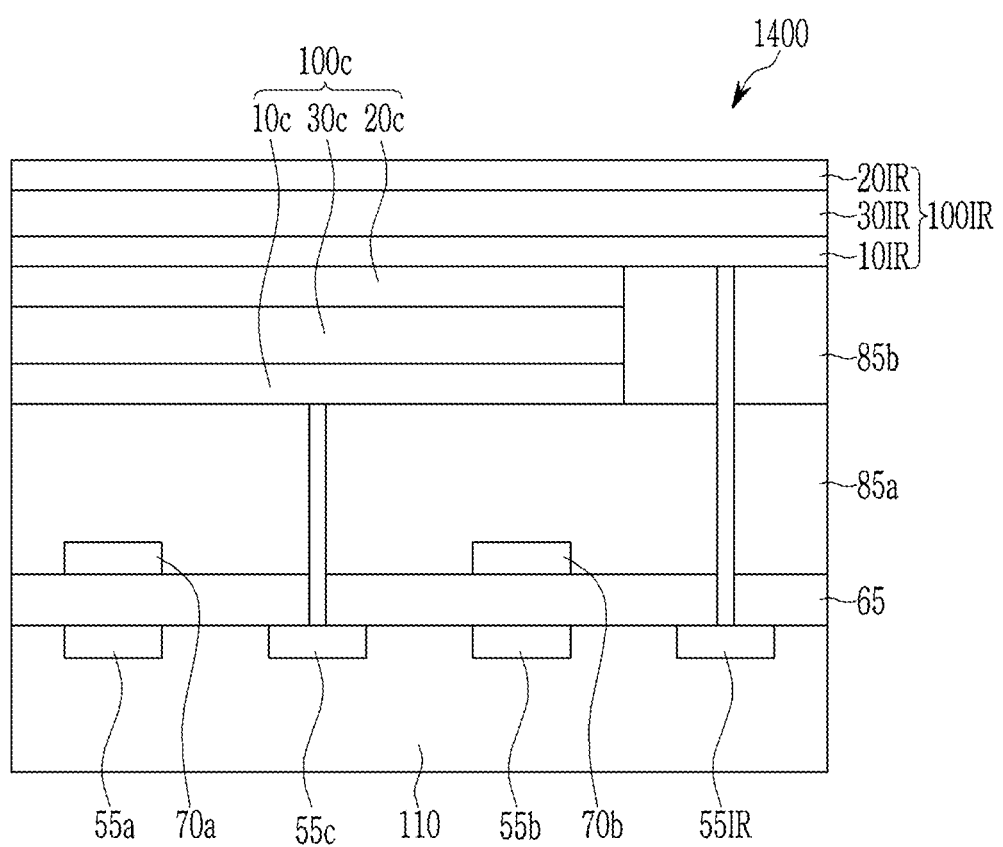
FIG. 14 is a schematic cross-sectional view of an organic CMOS image sensor according to some example embodiments.

FIG. 14 is a schematic cross-sectional view of an organic CMOS image sensor according to some example embodiments.

Referring to FIG. 14, an organic CMOS image sensor 1400 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first (e.g., blue) filter 70a; a second (e.g., red) filter 70b; a upper insulation layers 85a and 85b; a third (e.g., green) photoelectric device 100b; and an infrared/near infrared photoelectric device 100IR.

Figure 15:
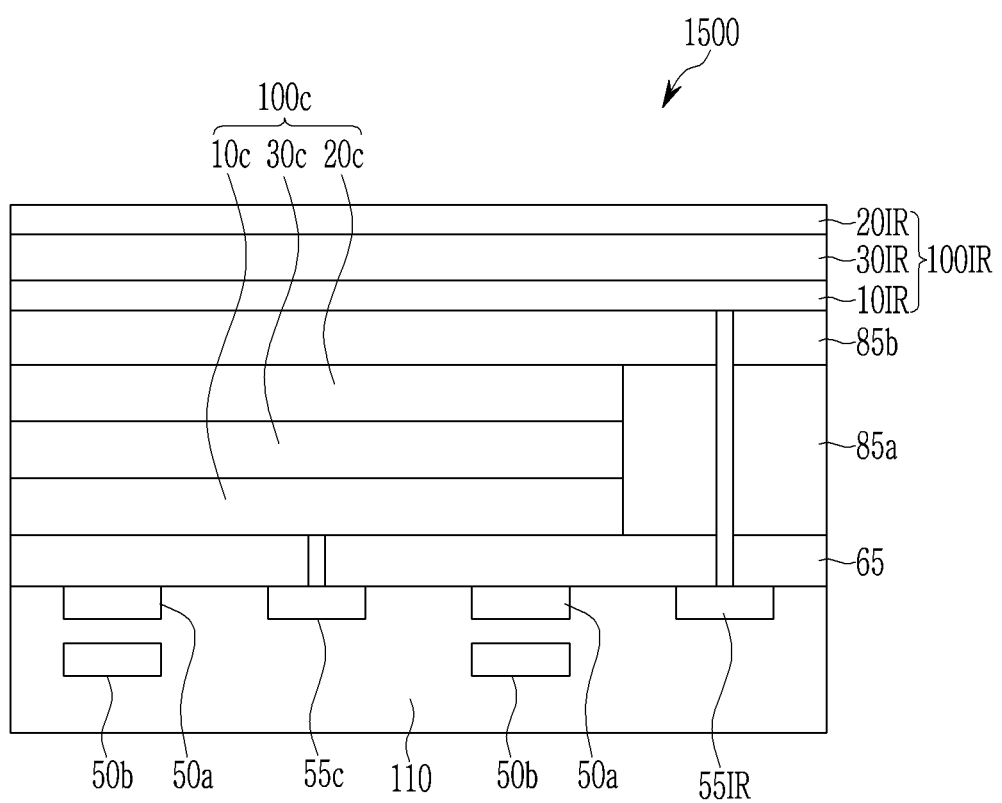
FIG. 15 is a schematic cross-sectional view of an organic CMOS image sensor according to some example embodiments.

FIG. 15 is a schematic cross-sectional view of an organic CMOS image sensor according to some example embodiments.

In the organic CMOS image sensor 1500 of FIG. 15, the first photo-sensing device 50a (e.g., a blue photodiode) and the second photo-sensing device 50b (e.g., a red photodiode) are stacked perpendicularly, differing from the organic CMOS image sensor 1400 of FIG. 14.

Figure 16:
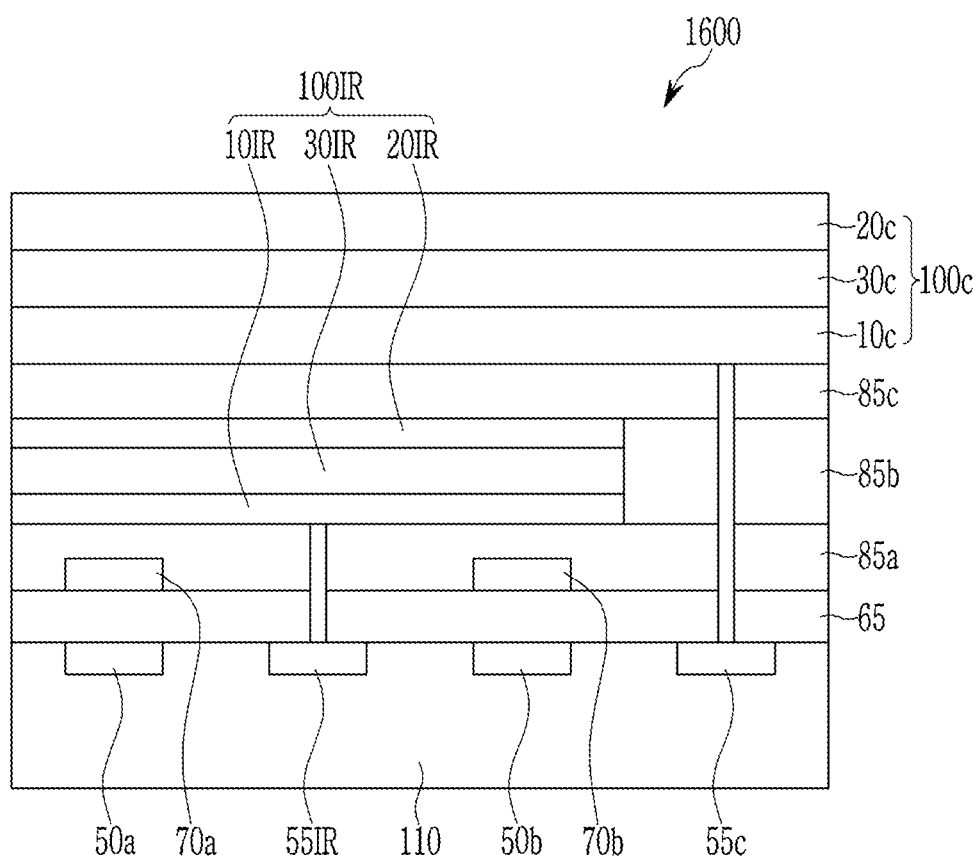
FIG. 16 is a schematic cross-sectional view of an organic CMOS image sensor according to some example embodiments.

FIG. 16 is a schematic cross-sectional view of an organic CMOS image sensor according to some example embodiments.

Referring to FIG. 16, an organic CMOS image sensor 1600 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first (e.g., blue) filter 70a; a second (e.g., red) filter 70b; upper insulation layers 85a, 85b, and 85c; an infrared/near infrared photoelectric device 100IR; and a third (e.g., green) photoelectric device 100c.

Figure 17:
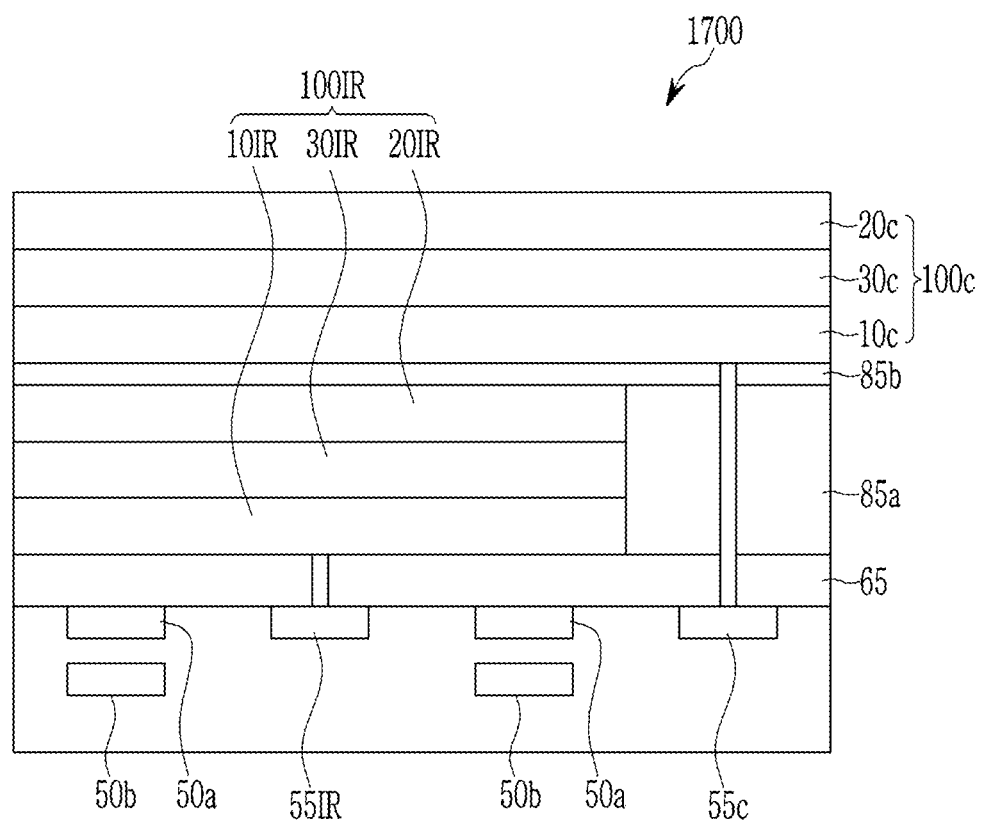
FIG. 17 is a schematic cross-sectional view of an organic CMOS image sensor according to some example embodiments.

FIG. 17 is a schematic cross-sectional view of an organic CMOS image sensor according to some example embodiments.

In the image sensor 1700 of FIG. 17, the first photo-sensing device 50a and the second photo-sensing device 50b are stacked perpendicularly, differing from the organic CMOS image sensor 1600 of FIG. 16.

Referring to at least FIGS. 3-17, one or more of the photoelectric devices included in any one of the image sensors illustrated in FIGS. 3-17 may be any of the example embodiments of photoelectric devices as described herein, including photoelectric devices including photoelectric conversion layers including any of the p-type semiconductors and any of the n-type semiconductors as described with regard to any of the example embodiments described herein.

The photoelectric device and the image sensor may be applied to various electronic devices, for example a mobile phone or a digital camera, but are not limited thereto.

Figure 18:
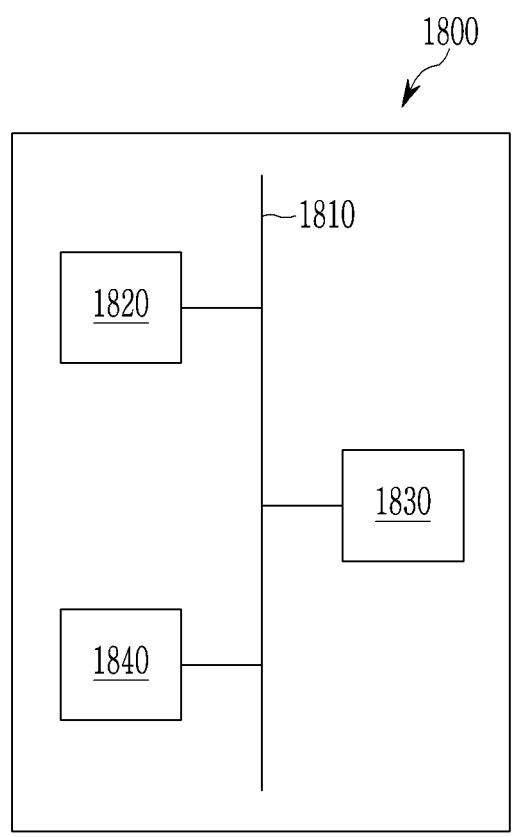
FIG. 18 is a schematic diagram of an electronic device 1800 according to some example embodiments.

FIG. 18 is a schematic diagram of an electronic device 1800 according to some example embodiments.

As shown in FIG. 18, an electronic device 1800 may include a processor 1820, a memory 1830, and an image sensor 1840 that are electrically coupled together via a bus 1810. The image sensor 1840 may be an image sensor of any of the example embodiments as described herein. The memory 1830, which may be a non-transitory computer readable medium, may store a program of instructions. The processor 1820 may execute the stored program of instructions to perform one or more functions. For example, the processor 1820 may be configured to process electric signals generated by the image sensor 1840. The processor 1820 may be configured to generate an output (e.g., an image to be displayed on a display interface) based on processing the electric signals.

Hereinafter, the embodiments are illustrated in more detail with reference to examples. However, these examples are exemplary, and the present disclosure is not limited thereto.

Manufacture of Photoelectric Device

Example 1

An about 150 nm-thick anode is formed by sputtering ITO on a glass substrate. Subsequently a 10 nm-thick charge auxiliary layer is formed on the anode by depositing the compound represented by Chemical Formula A (HOMO: 5.73 eV, LUMO: 2.35 eV). Then, a 150 nm-thick photoelectric conversion layer is formed on the charge auxiliary layer by codepositing the p-type semiconductor ($\lambda_{max}$: 560 nm, extinction coefficient ($@\lambda_{max}$): $8.2 \times 10^4$ cm$^{-1}$, HOMO: 5.5 eV, LUMO: 3.3 eV) represented by Chemical Formula B-1 and the n-type semiconductor ($\lambda_{max}$: 850 nm, HOMO: 5.7 eV, LUMO: 4.5 eV) represented by Chemical Formula C-1 in a 1:1 volume ratio. Then, a 7 nm thick cathode is formed on the photoelectric conversion layer by sputtering ITO. Then a 50 nm-thick anti-reflection layer is formed on the cathode by depositing aluminum oxide ($Al_2O_3$) and sealing it with a glass plate to manufacture a photoelectric device.

[Chemical Formula A]

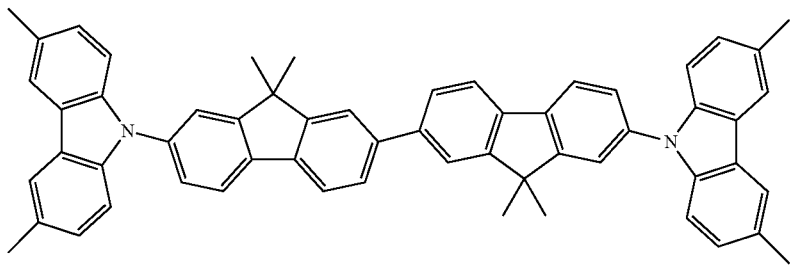

[Chemical Formula B-1]

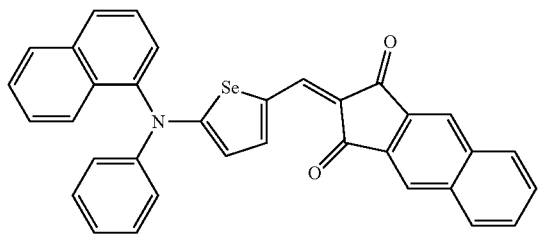

[Chemical Formula C-1]

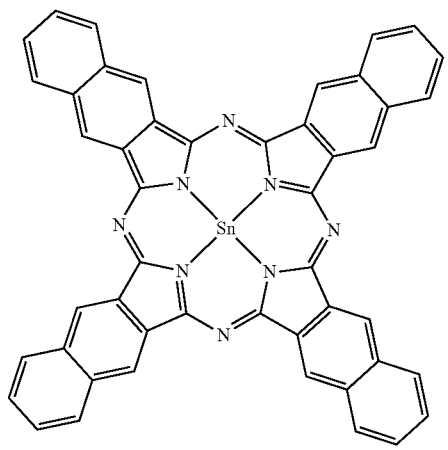

Example 2

A photoelectric device is manufactured according to the same method as Example 1, except that a 100 nm-thick photoelectric conversion layer is formed using the p-type semiconductor ($\lambda_{max}$: 550 nm, extinction coefficient ($@\lambda_{max}$): 7.5×10$^4$ cm$^{-1}$, HOMO: 5.6 eV, LUMO: 3.4 eV) represented by Chemical Formula B-2 instead of the p-type semiconductor represented by Chemical Formula B-1 and the n-type semiconductor represented by Chemical Formula C-2 ($\lambda_{max}$: 850 nm, HOMO: 6.3 eV, LUMO: 4.9 eV) instead of the n-type semiconductor represented by Chemical Formula C-1.

-continued

[Chemical Formula C-2]

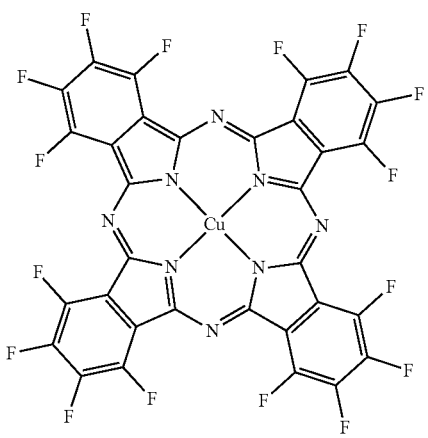

[Chemical Formula B-2]

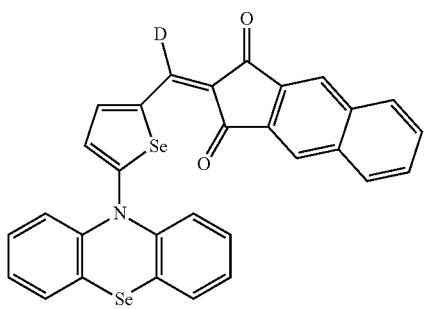

Example 3

A photoelectric device is manufactured according to the same method as Example 1, except that a 100 nm-thick photoelectric conversion layer is formed using the p-type semiconductor represented by Chemical Formula B-2 instead of the p-type semiconductor represented by Chemical Formula B-1 and the n-type semiconductor represented by Chemical Formula C-3 ($\lambda_{max}$: 900 nm, HOMO: 5.5 eV, LUMO: 4.3 eV) instead of the n-type semiconductor represented by Chemical Formula C-1.

[Chemical Formula C-3]

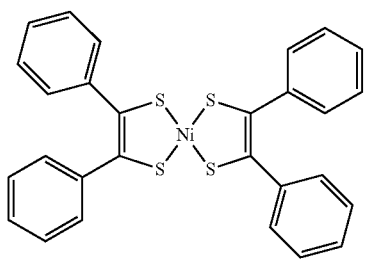

Comparative Example 1

A photoelectric device is manufactured according to the same method as Example 1, except that a 100 nm-thick photoelectric conversion layer is formed using fullerene (C60) as the n-type semiconductor instead of the n-type semiconductor represented by Chemical Formula C-1.

Comparative Example 2

A photoelectric device is manufactured according to the same method as Example 2, except that a 100 nm-thick photoelectric conversion layer is formed using fullerene (C60) as the n-type semiconductor instead of the n-type semiconductor represented by Chemical Formula C-2.

Comparative Example 3

A photoelectric device is manufactured according to the same method as Example 3, except that a 100 nm-thick photoelectric conversion layer is formed using fullerene (C60) as the n-type semiconductor instead of the n-type semiconductor represented by Chemical Formula C-3.

Evaluation I

Optical properties of the photoelectric devices according to Examples 1 to 3 and Comparative Examples 1 to 3 are evaluated.

The photoelectric conversion efficiency (EQE) is evaluated by an incident photon to current efficiency (IPCE) method in a wavelength spectrum of light of 400 nm to 720 nm.

The full width at half maximum (FWHM) is evaluated by normalizing photoelectric conversion efficiency (EQE) and measuring a width of a wavelength corresponding to a half of the photoelectric conversion efficiency at a peak wavelength.

The results are shown in Tables 1 to 3.

TABLE 1

| | Example 1 | Comparative Example 1 |
|---|---|---|
| $\lambda_{max}$ (nm) | 560 | 560 |
| FWHM (nm) | 100 | 130 |
| $EQE_{450\,nm}/EQE_{max}$ | 0.13 | 0.32 |

TABLE 2

| | Example 2 | Comparative Example 2 |
|---|---|---|
| $\lambda_{max}$ (nm) | 550 | 550 |
| FWHM (nm) | 105 | 110 |
| $EQE_{450\,nm}/EQE_{max}$ | 0.07 | 0.32 |

TABLE 3

| | Example 3 | Comparative Example 3 |
|---|---|---|
| $\lambda_{max}$ (nm) | 550 | 550 |
| FWHM (nm) | 105 | 110 |
| $EQE_{450\,nm}/EQE_{max}$ | 0.07 | 0.32 |

Referring to Tables 1 to 3, the photoelectric devices according to Examples exhibit relatively narrow full width at half maximum (FWHM) and a smaller ratio of the external quantum efficiency at a wavelength of 450 nm relative to the external quantum efficiency at a peak absorption wavelength ($\lambda_{max}$) compared with the photoelectric devices according to Comparative Examples. From the results, the photoelectric devices according to Examples have higher wavelength selectivity than the photoelectric devices according to Comparative Examples.

Evaluation II

Image sensors including the photoelectric devices according to Examples and Comparative Examples having structure shown in FIGS. 3 and 4 are designed and optical cross-talk of each image sensor is measured.

The optical cross-talk is evaluated by dividing a visible ray wavelength spectrum of light into three regions of greater than or equal to about 400 nm and less than about 440 nm (blue), about 520 nm to 560 nm (green), and greater than about 630 nm and less than or equal to about 670 nm and then, evaluating how much other light conversion devices in each region are optically interfered. That is, optical cross-talk in a green wavelength spectrum of light is indicated by a relative integral of sensitivity curves of the blue photoelectric device and the red photoelectric device in 520 nm to 560 nm when an integral of sensitivity curve of the green photoelectric device in 520 nm to 560 nm is 100. As the optical cross-talk is smaller, cross-talk of the image sensors are lowered and color mixing in a green wavelength spectrum of light is decreased.

The results are shown in Table 4.

TABLE 4

| | C.T (%) |
|---|---|
| Example 1 | 15 |
| Comparative Example 1 | 32 |
| Example 2 | 10 |
| Comparative Example 2 | 25 |
| Example 3 | 10 |
| Comparative Example 3 | 25 |

Referring to Table 4, the image sensors including photoelectric devices according to Examples exhibit smaller optical cross-talk compared with the image sensors including the photoelectric device according to Comparative Examples. From the results, the image sensors including photoelectric devices according to Examples have improved sensitivity compared with the image sensors including the photoelectric device according to Comparative Examples.

While this disclosure has been described in connection with what is presently considered to be at least some of the practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An image sensor, comprising:
a photoelectric device, the photoelectric device including
a first electrode and a second electrode facing each other; and
a photoelectric conversion layer between the first electrode and the second electrode, the photoelectric conversion layer configured to convert light in a particular portion of a visible wavelength spectrum of light into an electric signal, the photoelectric conversion layer including
a p-type semiconductor configured to selectively absorb light in a first wavelength spectrum of light of the visible wavelength spectrum of light, and
an n-type semiconductor having a peak absorption wavelength in a second wavelength spectrum of light of greater than or equal to about 750 nm, the n-type semiconductor forming a pn junction with the p-type semiconductor.

2. The image sensor of claim 1, wherein the n-type semiconductor has an energy bandgap of about 1.0 eV to about 1.5 eV.

3. The image sensor of claim 2, wherein
the n-type semiconductor has a lowest unoccupied molecular orbital (LUMO) energy level of about 3.5 eV to about 5.5 eV, and
the n-type semiconductor has a highest occupied molecular orbital (HOMO) energy level of about 4.5 eV to about 7.0 eV.

4. The image sensor of claim 1, wherein the peak absorption wavelength of the n-type semiconductor is in a wavelength spectrum of light of about 800 nm to about 1100 nm.

5. The image sensor of claim 1, wherein
the p-type semiconductor is configured to selectively absorb one wavelength spectrum of light having a first peak absorption wavelength, such that the one wavelength spectrum of light is one of
blue light such that the first peak absorption wavelength is in a blue wavelength spectrum of about 380 nm to about 500 nm,
green light such that the first peak absorption wavelength is in a green wavelength spectrum of about 500 nm to about 600 nm, or
red light such that the first peak absorption wavelength is in a red wavelength spectrum of about 600 nm to about 700 nm, and
an extinction coefficient at the first peak absorption wavelength is greater than or equal to about $0.5 \times 10^5$ cm$^{-1}$.

6. The image sensor of claim 1, wherein the p-type semiconductor is configured to selectively absorb green light having a peak absorption wavelength in a wavelength spectrum of about 520 nm to about 580 nm.

7. The image sensor of claim 6, wherein
the photoelectric conversion layer is configured to selectively absorb green light having a peak absorption wavelength in the wavelength spectrum of about 520 nm to about 580 nm, and a ratio ($EQE_{450\ nm}/EQE_{max}$) of external quantum efficiency ($EQE_{450\ nm}$) at 450 nm relative to external quantum efficiency ($EQE_{max}$) at the peak absorption wavelength of the photoelectric conversion layer is less than or equal to about 0.30.

8. The image sensor of claim 1, wherein the p-type semiconductor is an organic semiconductor having a core structure including an electron donating moiety, a pi conjugation linking group, and an electron accepting moiety.

9. The image sensor of claim 1, wherein the photoelectric conversion layer does not include fullerene or a fullerene derivative.

10. The image sensor of claim 1, wherein the photoelectric device further includes
a charge auxiliary layer between the first electrode and the photoelectric conversion layer, the charge auxiliary layer having an energy bandgap of greater than or equal to about 2.8 eV.

11. The image sensor of claim 1, further comprising:
a semiconductor substrate on the photoelectric device.

12. The image sensor of claim 1, wherein the photoelectric device further includes
a first photoelectric device configured to convert first visible light into a first electric signal, the first visible light being one of blue light, green light, and red light,
a second photoelectric device on the first photoelectric device, the second photoelectric device configured to convert second visible light into a second electric signal, the second visible light being one of blue light, green light, and red light, and
a third photoelectric device on the second photoelectric device, the third photoelectric device configured to convert third visible light into a third electric signal, the third visible light being one of blue light, green light, and red light,
wherein the first visible light, the second visible light, and the third visible light are different from each other.

13. The image sensor of claim 1, further comprising:
an infrared ray cut filter on one surface of the photoelectric device.

14. An electronic device comprising the image sensor of claim 1.

15. An image sensor, comprising:
a photoelectric device, the photoelectric device including
a first electrode and a second electrode facing each other, and
a photoelectric conversion layer between the first electrode and the second electrode, the photoelectric conversion layer configured to electrically convert one of blue light, green light, or red light,
wherein the photoelectric conversion layer includes
a first semiconductor associated with an absorption spectrum of a first peak absorption wavelength, and
a second semiconductor associated with an absorption spectrum of a second peak absorption wavelength that is longer than the first peak absorption wavelength by about 100 nm or greater, the second semiconductor forming a pn junction with the first semiconductor.

16. The image sensor of claim 15, wherein
the first peak absorption wavelength is in one wavelength spectrum of
a blue wavelength spectrum of about 380 nm to about 500 nm,
a green wavelength spectrum of about 500 nm to about 600 nm, and a red wavelength spectrum of about 600 nm to about 700 nm, and the second peak absorption wavelength is in an infrared wavelength spectrum of greater than or equal to about 750 nm.

17. The image sensor of claim 16, wherein the first peak absorption wavelength is in a wavelength spectrum of about 520 nm to about 580 nm, and the second peak absorption wavelength is in a wavelength spectrum of about 800 nm to about 1100 nm.

18. The image sensor of claim 15, wherein the first semiconductor has an energy bandgap of about 1.7 eV to about 2.3 eV, and the second semiconductor has an energy bandgap of about 1.0 eV to about 1.5 eV.

19. The image sensor of claim 15, wherein the photoelectric conversion layer does not include fullerene or a fullerene derivative.

20. An image sensor, comprising:

a semiconductor substrate; and a plurality of photoelectric devices on the semiconductor substrate, the plurality of photoelectric devices configured to convert different ones of blue light, green light, or red light into electric signals, respectively, each photoelectric device of the plurality of photoelectric devices including a first electrode and a second electrode facing each other, and a photoelectric conversion layer between the first electrode and the second electrode, the photoelectric conversion layer configured to electrically convert a third light of blue light, green light, or red light, wherein the photoelectric conversion layer includes a first semiconductor associated with an absorption spectrum of a first peak absorption wavelength, the first peak absorption wavelength being in one wavelength spectrum of a blue wavelength spectrum, a green wavelength spectrum, and a red wavelength spectrum, and a second semiconductor associated with an absorption spectrum of a second peak absorption wavelength that is longer than the first peak absorption wavelength by about 100 nm or greater.

21. The image sensor of claim 20, further comprising:

an infrared photoelectric device on the semiconductor substrate, the infrared photoelectric device configured to convert infrared light into electric signals.

22. The image sensor of claim 21, wherein the infrared photoelectric device is on the plurality of photoelectric devices.

23. The image sensor of claim 22, wherein the infrared photoelectric device is between the plurality of photoelectric devices and the semiconductor substrate.

* * * * *